US011205753B2

United States Patent
Yan et al.

(10) Patent No.: US 11,205,753 B2
(45) Date of Patent: Dec. 21, 2021

(54) USE OF SEQUENTIAL PROCESSING FOR HIGHLY EFFICIENT ORGANIC SOLAR CELLS BASED ON CONJUGATED POLYMERS WITH TEMPERATURE DEPENDENT AGGREGATION

(71) Applicant: The Hong Kong University of Science and Technology, Hong Kong (CN)

(72) Inventors: He Yan, Hong Kong (CN); Guangye Zhang, Hong Kong (CN)

(73) Assignee: The Hong Kong University of Science and Technology, Hong Kong (CN)

( * ) Notice: Subject to any disclaimer, the term of this patent is extended or adjusted under 35 U.S.C. 154(b) by 116 days.

(21) Appl. No.: 16/500,430

(22) PCT Filed: Apr. 25, 2018

(86) PCT No.: PCT/CN2018/084500
§ 371 (c)(1),
(2) Date: Oct. 3, 2019

(87) PCT Pub. No.: WO2018/196791
PCT Pub. Date: Nov. 1, 2018

(65) Prior Publication Data
US 2021/0119130 A1 Apr. 22, 2021

Related U.S. Application Data

(60) Provisional application No. 62/602,473, filed on Apr. 25, 2017.

(51) Int. Cl.
*H01L 51/00* (2006.01)
*H01L 51/05* (2006.01)
*H01L 51/42* (2006.01)

(52) U.S. Cl.
CPC ...... *H01L 51/0036* (2013.01); *H01L 51/0007* (2013.01); *H01L 51/0028* (2013.01); *H01L 51/0043* (2013.01); *H01L 51/0046* (2013.01); *H01L 51/0047* (2013.01); *H01L 51/0566* (2013.01); *H01L 51/4253* (2013.01)

(58) Field of Classification Search
CPC ............. H01L 51/0026; H01L 51/4253; H01L 51/0036; H01L 51/0047; H01L 51/0508
See application file for complete search history.

(56) References Cited

U.S. PATENT DOCUMENTS 9,505,770 B2 * 11/2016 McGrath .............. C07D 487/22
9,985,231 B2 * 5/2018 Huang ................ H01L 51/4253
(Continued)

OTHER PUBLICATIONS

Alexander L. Ayzner, et.al., Reappraising the Need for Bulk Heterojunctions in Polymer-Fullerene Photovoltaics: The Role of Carrier Transport in All-Solution-Processed P3HT/PCBM Bilayer Solar Cells, J. Phys. Chem. C 2009, 113, 20050-20060.
(Continued)

*Primary Examiner* — Dung A. Le
(74) *Attorney, Agent, or Firm* — Spruson & Ferguson (Hong Kong) Limited

(57) ABSTRACT

Provided herein is a sequentially processed fabrication method involving donor-acceptor conjugated polymers with temperature dependent aggregation (TDA) useful for the preparation of organic semiconductors with improved properties.

20 Claims, 20 Drawing Sheets

(56) References Cited

U.S. PATENT DOCUMENTS

2017/0057962 A1* 3/2017 Jenekhe .................. C09B 5/62
2019/0013474 A1* 1/2019 Yan .................... H01L 51/0036

OTHER PUBLICATIONS

Alexandre M. Nardes et. al., Photoinduced Charge Carrier Generation and Decay in Sequentially Deposited Polymer/Fullerene Layers: Bulk Heterojunction vs Planar Interface, J. Phys. Chem. C 2012, 116, 7293-7305.

M.K. Wong et al., Investigation of the factors affecting the power conversion efficiency of all-solution-processed bilayer' P3HT:PCBM solar cells, Synthetic Metals 170 (2013) 1-6.

Ji Sun Moon et al., Spontaneous Formation of Bulk Heterojunction Nanostructures: Multiple Routes to Equivalent Morphologies, Nano Lett. 2011, 11, 1036-1039.

Steven A. Hawks et. al., Comparing Matched Polymer:Fullerene Solar Cells Made by Solution-Sequential Processing and Traditional Blend Casting: Nanoscale Structure and Device Performance, J. Phys. Chem. C 2014, 118, 17413-17425.

Guangye Zhang et al., Crystallinity Effects in Sequentially Processed and Blend-Cast Bulk-Heterojunction Polymer/Fullerene Photovoltaics, J. Phys. Chem. C 2014, 118, 18424-18435.

Anna Loiudice et al., Graded vertical phase separation of donor/acceptor species for polymer solar cells, Solar Energy Materials & Solar Cells 100 (2012) 147-152.

Masoud Ghasemi et al., Panchromatic Sequentially Cast Ternary Polymer Solar Cells, Adv. Mater. 2016, DOI: 10.1002/adma.201604603.

Jordan C. Aguirre et al., Sequential Processing for Organic Photovoltaics: Design Rules for Morphology Control by Tailored Semi-Orthogonal Solvent Blends, Adv. Energy Mater. 2015, 5, 1402020.

Pei Cheng et al., Efficient and stable organic solar cells via sequential process, J. Name., 2013, 00, 1-3.

Andrew J. Clulow et al., Time-Resolved Neutron Reflectometry and Photovoltaic Device Studies on Sequentially Deposited PCDTBT-Fullerene Layers, dx.doi.org/10.1021/la5020779 | Langmuir.

Caili Lang et al., Utilizing intermixing of conjugated polymer and fullerene from sequential solution processing for efficient polymer solar cells, Organic Electronics 36 (2016) 82e88.

* cited by examiner

USE OF SEQUENTIAL PROCESSING FOR HIGHLY EFFICIENT ORGANIC SOLAR CELLS BASED ON CONJUGATED POLYMERS WITH TEMPERATURE DEPENDENT AGGREGATION

CROSS-REFERENCE TO RELATED APPLICATIONS

This application claims the benefit of priority of U.S. provisional application 62/602,473, filed on 25 Apr. 2017, the contents of it being hereby incorporated by reference in its entirety for all purposes.

FIELD OF THE INVENTION

The present disclosure relates to the application of donor-acceptor conjugated polymers with temperature dependent aggregation (TDA) in sequentially processed organic electronic (OE) devices, methods for the device fabrication used therein, and the use of fabrication procedures containing such polymers as semiconductors in organic electronic (OE) devices, such as in organic photovoltaic (OPV) and organic field-effect transistor (OFET) devices.

BACKGROUND OF THE INVENTION

In recent years there has been growing interest in the use of organic semiconductors, including conjugated polymers, for various electronic applications.

One particular area of interest are OPVs. Organic semiconductors have found use in OPV as they allow devices to be manufactured by solution-processing techniques, such as spin casting and printing. Solution processing can be carried out cheaper and on a larger scale as compared to evaporative techniques used to make inorganic thin film devices.

The state-of-the-art device architecture of OPV devices is based on the use of the bulk heterojunction (BHJ) structure in the active medium of the device. The formation of the BHJ structure is typically achieved by blending the electron donating material and the electron accepting material together in a single solution. The morphology of blend-cast (BC) BHJ films is dictated by multiple factors, including the donor/acceptor miscibility, the propensity of one or both materials to crystallize, the relative solubilities of the two materials in the casting solution, the drying kinetics of the film, the presence of any solvent additives, etc. Because the nm-scale morphology depends on so many of the details of how the film is cast, the device performance of BC BHJ solar cells is hypersensitive to the processing kinetics of the active layer. Thus, for any new set of OPV materials, an Edisonian approach involving the fabrication of hundreds of BC devices is needed to find the processing conditions that lead to the optimal morphology and best device performance. To reduce the morphological uncertainty, there are generally two approaches: one is based on the design of novel materials with properties that dominate the morphology formation while the other is based on the development of novel device fabrication techniques.

From the material property design point of view, one of the most effective method to control the active layer morphology is through the use of conjugated polymers donors with temperature dependent aggregation (TDA) behavior. Multiple studies have shown that polymers with strong temperature dependent aggregation serve the role of dominating the overall morphology during the blend film formation. Such polymers have been shown to achieve highly crystalline, yet small domains with high domain purities in various binary BHJ systems. Thus, the use of such polymers could be an effective way to control of the morphology in BHJ OPVs.

From the device fabrication point of view, although most polymer/fullerene-based OPVs are cast from a blend of the components in solution, it is also possible to sequentially process (SqP) the polymer and fullerene layers from quasi-orthogonal solvents. SqP not only produces photovoltaic devices with efficiencies comparable to the more traditional BHJ solar cells produced by BC, but also offers the advantage that could make it the preferred route for large-scale fabrication of polymer-based OPVs. First, films produced via SqP have a more reproducible morphology because SqP does not rely on kinetic control of the nm-scale structure, resulting in devices that behave more consistently. Second, since the two materials are deposited separately, one can optimize or otherwise deliberately alter the donor material (e.g., by chemical doping) either before or after it has been processed, without unwanted chemistry occurring with the electron-accepting material. Finally, many solubility issues can be bypassed since one can separately choose optimal solvents for the donor and acceptor materials. Thus, the SqP technique potentially opens the photovoltaic field to a variety of donor and acceptor materials that once were not usable due to compatibility issues between solvents and materials. Thus, there is a need for improved methods for preparing polymer based OPVs.

SUMMARY OF THE INVENTION

The present disclosure relates to the application of SqP to TDA polymer-based OPVs. Demonstration of efficient OPV devices based on combinations of multiple sets of TDA polymers and acceptor materials, such as fullerene derivatives, is included.

The present subject matter further relates to the use of a device fabrication procedure as described herein, especially for the preparation of OE devices and rigid or flexible OPV cells and devices.

The present subject matter further relates to an OE device prepared from a formulation as described above and below. The OE devices contemplated in this regard include, without limitation, organic field effect transistors (OFET), integrated circuits (IC), thin film transistors (TFT), Radio Frequency Identification (RFID) tags, organic light emitting diodes (OLED), organic light emitting transistors (OLET), electroluminescent displays, organic photovoltaic (OPV) cells, organic solar cells (O-SC), flexible OPVs and O-SCs, organic laser diodes (O-laser), organic integrated circuits (O-IC), lighting devices, sensor devices, electrode materials, photoconductors, photodetectors, electrophotographic recording devices, capacitors, charge injection layers, Schottky diodes, planarising layers, antistatic films, conducting substrates, conducting patterns, photoconductors, electrophotographic devices, organic memory devices, biosensors and biochips.

The present subject matter further provides a thin film comprising a conjugated polymer and an acceptor material, such as a fullerene or fullerene derivative, as described herein.

The use of organic solvents such as ODCB (1,2-dichlorobenzene), CB (chlorobenzene) and chloroform, or a mixture of these solvents as the solvent for the acceptor materials, e.g., fullerene derivatives, has not been demonstrated before for making efficient SqP devices.

In a first aspect, provided herein is a method of preparing a bulk heterojunction material comprising the steps of:
a. providing a thin film comprising a donor material, wherein the donor material exhibits temperature dependent aggregation;
b. depositing an acceptor solution comprising an acceptor solvent and an acceptor material on the thin film, wherein the donor material is substantially insoluble in the acceptor solvent; and
c. annealing the acceptor material on the thin film thereby forming the bulk heterojunction material.

In a first embodiment of the first aspect, provided herein is the method of the first aspect, wherein the donor material is a polymer selected from the group consisting of:

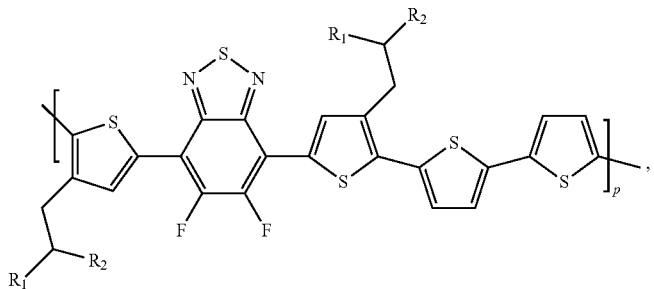

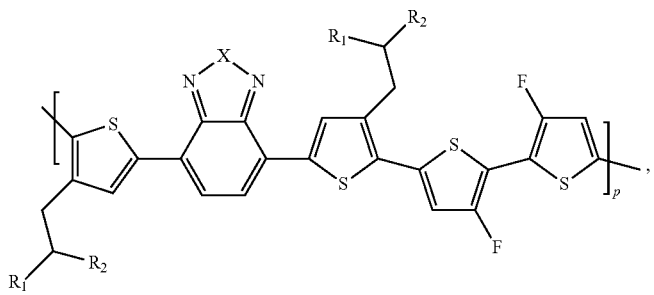

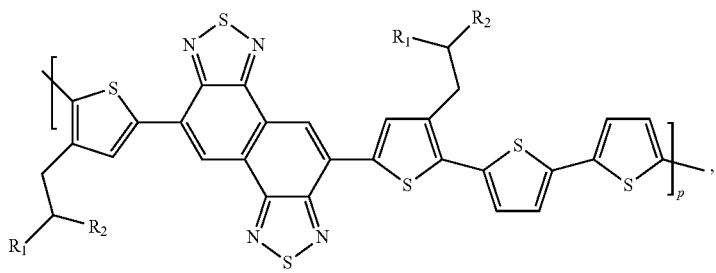

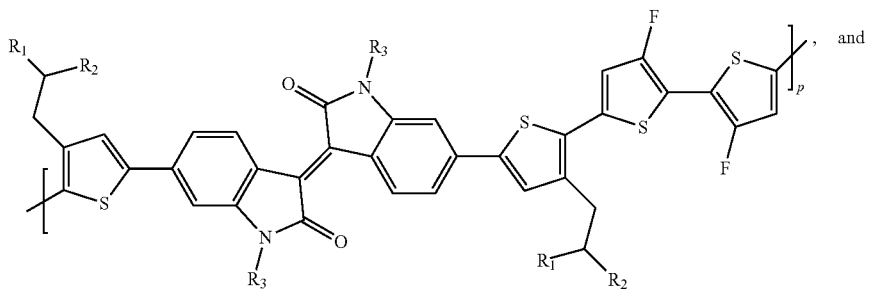

, and

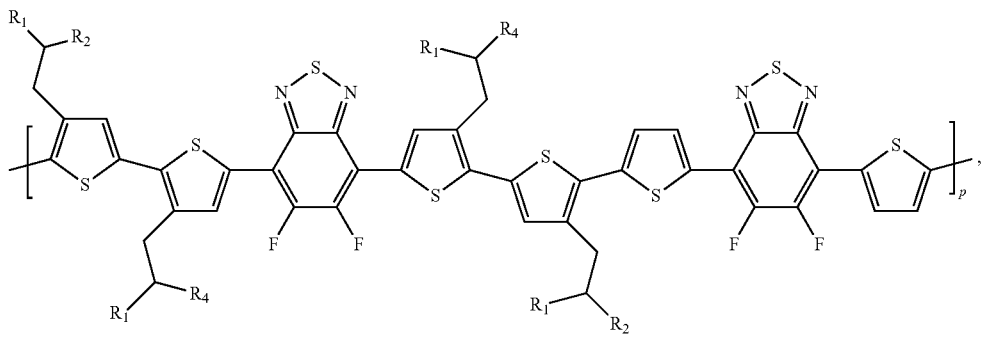

wherein p is 20-500;

X is S or $N(C_1-C_{12})$alkyl;

each of $R_1$, $R_2$, and $R_4$ is independently $(C_5-C_{30})$alkyl; and $R_3$ is $(C_4-C_{12})$alkyl.

In a second embodiment of the first aspect, provided herein is the method of the first aspect further comprising the step of depositing a donor solution comprising a donor solvent and the donor material on the surface of a substrate thereby forming the substrate and a thin film comprising the donor material.

In a third embodiment of the first aspect, provided herein is the method of the second embodiment of the first aspect, wherein the donor solvent comprises at least one of 1,2,4-trimethylbenzene, chlorobenzene, and 1,2-dichlorbenzene.

In a fourth embodiment of the first aspect, provided herein is the method of the third embodiment of the first aspect wherein the donor solvent further comprises 1,8-diiodooctane.

In a fifth embodiment of the first aspect, provided herein is the method of the third embodiment of the first aspect, wherein the temperature of the donor solution is above the temperature that the donor material aggregates in the donor solvent.

In a sixth embodiment of the first aspect, provided herein is the method of the fifth embodiment of the first aspect, wherein the temperature of the donor solution is about 60° C. to about 150° C.

In a seventh embodiment of the first aspect, provided herein is the method of the first aspect, wherein the thin film comprising the donor material comprises a plurality of substantially crystalline domains.

In an eighth embodiment of the first aspect, provided herein is the method of the first aspect, wherein the acceptor material is a $C_{60}$ or $C_{70}$ fullerene derivative.

In a ninth embodiment of the first aspect, provided herein is the method of the eighth embodiment of the first aspect, wherein the acceptor solvent is at least one of chlorobenzene, 1,2-dichlorbenzene, and chloroform.

In a tenth embodiment of the first aspect, provided herein is the method of the ninth embodiment of the first aspect, wherein the donor material is substantially insoluble at the temperature that the acceptor solution is deposited on the thin film.

In an eleventh embodiment of the first aspect, provided herein is the method of the tenth embodiment of the first aspect, wherein the temperature of the acceptor solution is about 20° C. to about 30° C.

In a twelfth embodiment of the first aspect, provided herein is the method of the first embodiment of the first aspect, further comprising the steps of depositing a donor solution comprising a donor solvent and the donor material on a surface of a substrate, wherein the donor solvent is at least one of 1,2,4-trimethylbenzene, chlorobenzene, and 1,2-dichlorbenzene; and the temperature of the donor solution is about 80° C. to about 120° C.

In a thirteenth embodiment of the first aspect, provided herein is the method of the twelfth embodiment of the first aspect, wherein the acceptor solvent is at least one of chlorobenzene, 1,2-dichlorbenzene, and chloroform; the acceptor material is a $C_{60}$ or $C_{70}$ fullerene derivative; and the temperature of the acceptor solution is about 20° C. to about 30° C.

In a fourteenth embodiment of the first aspect, provided herein is the method of the thirteenth embodiment of the first aspect, wherein the $C_{60}$ or $C_{70}$ fullerene derivative is

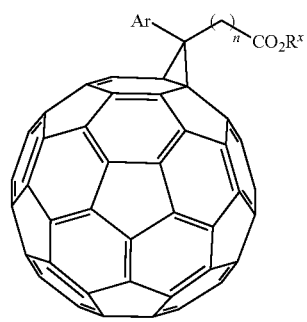

wherein n is 1, 2, 4, 5, or 6;

Ar is aryl or heteroaryl; and $R^x$ is alkyl, alkenyl, alkynyl, cycloalkyl, aryl, araalkyl, or heteroaryl.

In a fifteenth embodiment of the first aspect, provided herein is the method of the thirteenth embodiment of the first aspect, wherein the acceptor material is selected from the group consisting of:

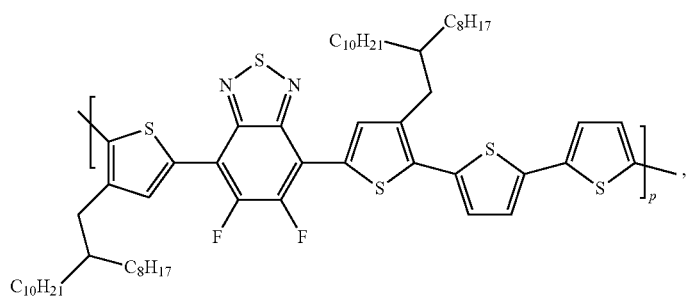,
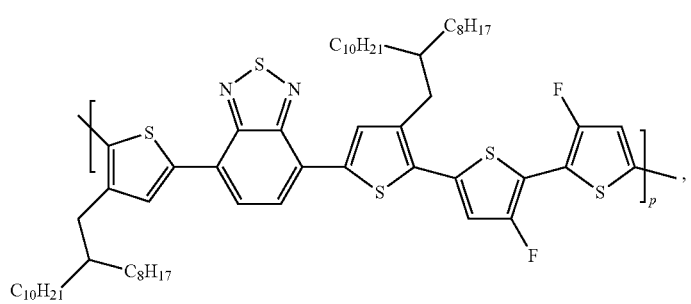,
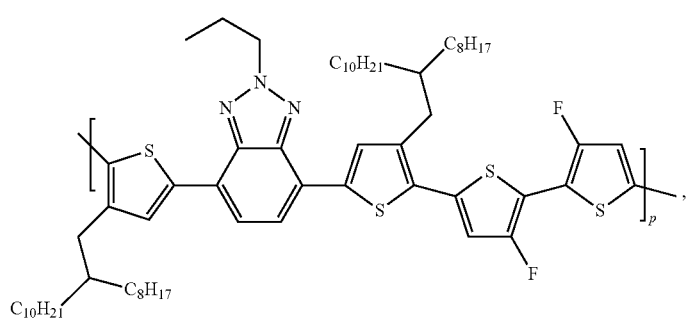,
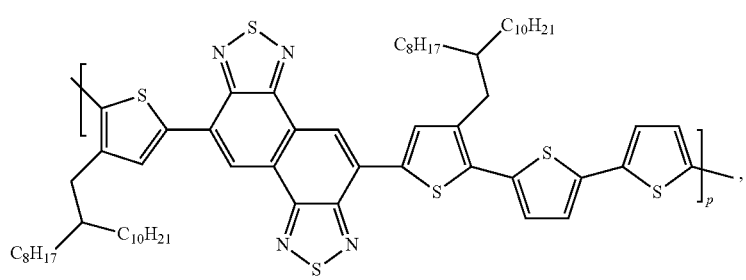,
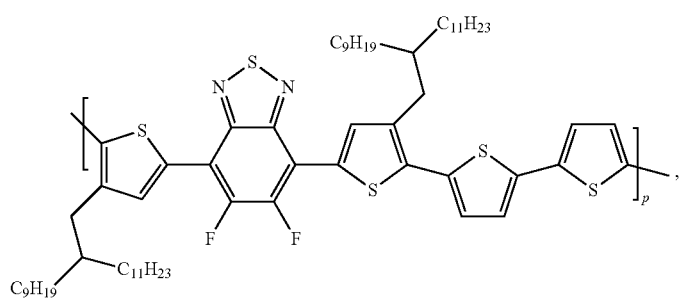,

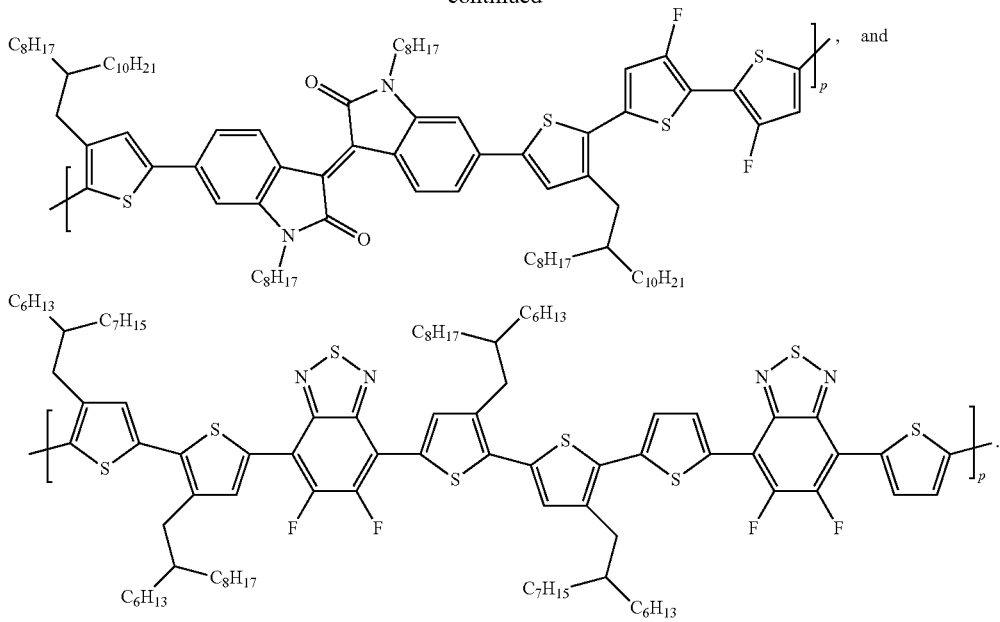

, and

In a sixteenth embodiment of the first aspect, provided herein is the method of the fifteenth embodiment of the first aspect, wherein the acceptor material is a $C_{70}$ fullerene derivative having the structure:

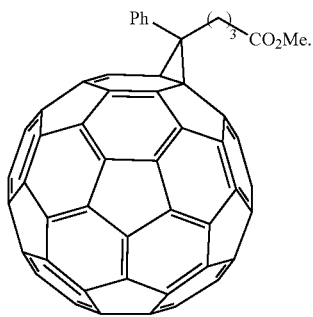

In a second aspect, provided herein is a bulk heterojunction material made according to the method of the first aspect.

In a third aspect, provided herein is an organic electronic device comprising the bulk heterojunction material of the second aspect.

In a first embodiment of the third aspect, provided herein is the organic electronic device of the third aspect, wherein the organic electronic device is an organic photovoltaic device or an organic field-effect transistor device.

Without wishing to be bound by theory, it is believed that the improved performance exhibited by the bulk heterojunction materials prepared according to the methods described herein are based, at least in part, on the polymers' TDA nature and the careful selection of the donor solvent and acceptor solvents. If polymers without TDA were to be used as the underlayer, the use of these aforementioned organic solvents would dissolve or at least partially dissolve the polymer underlayer. The TDA polymers in this invention showed almost no dissolution in these solvents at room temperature (the temperature for fullerene solution deposition), confirmed by UV-Vis spectroscopy.

Devices based on TDA polymers fabricated with such SqP technique were found to show high performance in both small area and large area scales. In small area devices, the PCE of SqP devices were comparable or slightly higher than BC devices, depending on the system and processing condition. In large area devices, the demonstrated case showed that SqP devices exhibited more uniform active layer film formation and thus much higher PCEs than the BC ones. More importantly, the large area SqP device perform more consistently than the BC ones, confirmed by their reduced standard deviations in device parameters. These findings revealed the suitability of SqP for the production of industrial-scale devices with TDA polymers.

The successful demonstration of efficient large area devices rely on the advantage of SqP that the polymer underlayer can be optimized without the disturbance from the presence of the fullerene derivatives. The film quality of the pure polymer underlayer was significantly enhanced by the addition of 1,8-diiodooctane (DIO) and as a result, the overall film homogeneity was dramatically enhanced after the deposition of fullerene, compared to the poorer quality of the BC films.

The formulations, methods and devices of the present subject matter provide surprising improvements in the efficiency of the OE devices and the production thereof. Unexpectedly, the performance, the lifetime and the efficiency of the OE devices can be improved, if these devices are achieved by using a formulation of the present subject matter. Furthermore, the formulation of the present subject matter provides an astonishingly high level of film forming. Especially, the homogeneity and the quality of the films can be improved. In addition thereto, the present subject matter enables better solution printing of OE devices, especially OPV devices.

BRIEF DESCRIPTION OF THE DRAWINGS

The above and other objects and features of the present disclosure will become apparent from the following description of the invention, when taken in conjunction with the accompanying drawings, in which.

Figure 1:
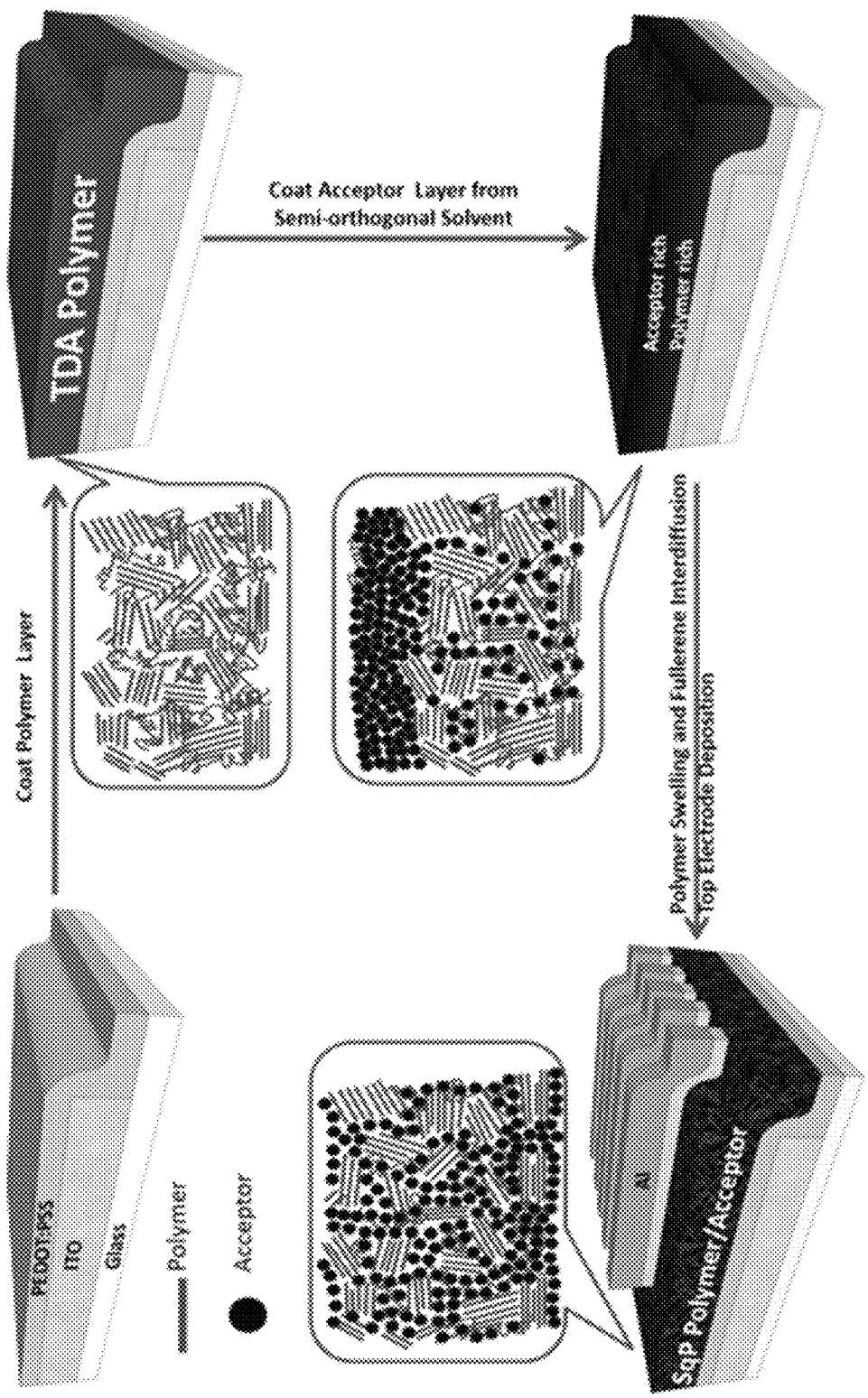
FIG. 1 depicts a schematic of one embodiment of the procedure for the fabrication of SqP solar cell devices with a TDA polymer described herein.

It should be understood that the drawings described herein are for illustration purposes only. The drawings are not necessarily to scale, with emphasis generally being placed upon illustrating the principles of the present teachings. The drawings are not intended to limit the scope of the present teachings in any way.

DETAILED DESCRIPTION OF THE INVENTION

Definitions

Throughout the application, where compositions are described as having, including, or comprising specific components, or where processes are described as having, including, or comprising specific process steps, it is contemplated that compositions of the present teachings can also consist essentially of, or consist of, the recited components, and that the processes of the present teachings can also consist essentially of, or consist of, the recited process steps.

In the application, where an element or component is said to be included in and/or selected from a list of recited elements or components, it should be understood that the element or component can be any one of the recited elements or components, or the element or component can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

It should be understood that the order of steps or order for performing certain actions is immaterial so long as the present teachings remain operable. Moreover, two or more steps or actions may be conducted simultaneously.

As used herein, a "p-type semiconductor material" or a "donor" material refers to a semiconductor material, for example, an organic semiconductor material, having holes as the majority current or charge carriers. In some embodiments, when a p-type semiconductor material is deposited on a substrate, it can provide a hole mobility in excess of about $10^{-5}$ cm$^2$/Vs. In the case of field-effect devices, a p-type semiconductor also can exhibit a current on/off ratio of greater than about 10.

As used herein, an "n-type semiconductor material" or an "acceptor" material refers to a semiconductor material, for example, an organic semiconductor material, having electrons as the majority current or charge carriers. In some embodiments, when an n-type semiconductor material is deposited on a substrate, it can provide an electron mobility in excess of about $10^{-5}$ cm$^2$/Vs. In the case of field-effect devices, an n-type semiconductor also can exhibit a current on/off ratio of greater than about 10.

As used herein, "mobility" refers to a measure of the velocity with which charge carriers, for example, holes (or units of positive charge) in the case of a p-type semiconductor material and electrons (or units of negative charge) in the case of an n-type semiconductor material, move through the material under the influence of an electric field. This parameter, which depends on the device architecture, can be measured using a field-effect device or space-charge limited current measurements.

As used herein, a compound can be considered "ambient stable" or "stable at ambient conditions" when a transistor incorporating the compound as its semiconducting material exhibits a carrier mobility that is maintained at about its initial measurement when the compound is exposed to ambient conditions, for example, air, ambient temperature, and humidity, over a period of time. For example, a compound can be described as ambient stable if a transistor incorporating the compound shows a carrier mobility that does not vary more than 20% or more than 10% from its initial value after exposure to ambient conditions, including, air, humidity and temperature, over a 3 day, 5 day, or 10 day period.

As used herein, fill factor (FF) is the ratio (given as a percentage) of the actual maximum obtainable power, (Pm or Vmp*Jmp), to the theoretical (not actually obtainable) power, (Jsc*Voc). Accordingly, FF can be determined using the equation:

FF=(Vmp*Jmp)/(Jsc*Voc)

where Jmp and Vmp represent the current density and voltage at the maximum power point (Pm), respectively, this point being obtained by varying the resistance in the circuit until J*V is at its greatest value; and Jsc and Voc represent the short circuit current and the open circuit voltage, respectively. Fill factor is a key parameter in evaluating the performance of solar cells. Commercial solar cells typically have a fill factor of about 0.60% or greater.

As used herein, the open-circuit voltage (Voc) is the difference in the electrical potentials between the anode and the cathode of a device when there is no external load connected.

As used herein, "small area" devices relates to OPV, or other types of OE devices with device area in the range of 1-10 mm$^2$.

As used herein, "large area" devices relates to OPV, or other types of OE devices with device area greater than of 50 mm$^2$.

As used herein, the power conversion efficiency (PCE) of a solar cell is the percentage of power converted from absorbed light to electrical energy. The PCE of a solar cell can be calculated by dividing the maximum power point (Pm) by the input light irradiance (E, in W/m2) under standard test conditions (STC) and the surface area of the solar cell (Ac in m2). STC typically refers to a temperature of 25° C. and an irradiance of 1000 W/m2 with an air mass 1.5 (AM 1.5) spectrum.

As used herein, a component (such as a thin film layer) can be considered "photoactive" if it contains one or more compounds that can absorb photons to produce excitons for the generation of a photocurrent.

As used herein, "solution-processable" refers to compounds (e.g., polymers), materials, or compositions that can be used in various solution-phase processes including spin-coating, printing (e.g., inkjet printing, gravure printing, offset printing and the like), spray coating, electrospray coating, drop casting, dip coating, blade coating, and the like.

As used herein, a "semicrystalline polymer" refers to a polymer that has an inherent tendency to crystallize at least partially either when cooled from a melted state or deposited from solution, when subjected to kinetically favorable conditions such as slow cooling, or low solvent evaporation rate and so forth. The crystallization or lack thereof can be readily identified by using several analytical methods, for example, differential scanning calorimetry (DSC) and/or X-ray diffraction (XRD).

As used herein, "annealing" refers to a post-deposition heat treatment to the semicrystalline polymer film in ambient or under reduced/increased pressure for a time duration of more than 100 seconds, and "annealing temperature" refers to the maximum temperature that the polymer film is exposed to for at least 60 seconds during this process of annealing. Without wishing to be bound by any particular theory, it is believed that annealing can result in an increase of crystallinity in the polymer film, where possible, thereby increasing field effect mobility. The increase in crystallinity can be monitored by several methods, for example, by comparing the differential scanning calorimetry (DSC) or X-ray diffraction (XRD) measurements of the as-deposited and the annealed films.

As used herein, a "polymeric compound" (or "polymer") refers to a molecule including a plurality of one or more repeating units connected by covalent chemical bonds. A polymeric compound can be represented by General Formula I:

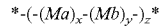  General Formula I wherein each Ma and Mb is a repeating unit or monomer. The polymeric compound can have only one type of repeating unit as well as two or more types of different repeating units. When a polymeric compound has only one type of repeating unit, it can be referred to as a homo-polymer. When a polymeric compound has two or more types of different repeating units, the term "copolymer" or "copolymeric compound" can be used instead. For example, a copolymeric compound can include repeating units where Ma and Mb represent two different repeating units. Unless specified otherwise, the assembly of the repeating units in the copolymer can be head-to-tail, head-to-head, or tail-to-tail. In addition, unless specified otherwise, the copolymer can be a random copolymer, an alternating copolymer, or a block copolymer. For example, General Formula I can be used to represent a copolymer of Ma and Mb having x mole fraction of Ma and y mole fraction of Mb in the copolymer, where the manner in which co-monomers Ma and Mb is repeated can be alternating, random, region-random, region-regular, or in blocks, with up to z co-monomers present. In addition to its composition, a polymeric compound can be further characterized by its degree of polymerization (n) and molar mass (e.g., number average molecular weight (M) and/or weight average molecular weight (Mw) depending on the measuring technique(s)).

As used herein, "halo" or "halogen" refers to fluoro, chloro, bromo, and iodo.

As used herein, "alkyl" refers to a straight-chain or branched saturated hydrocarbon group. Examples of alkyl groups include methyl(Me), ethyl (Et), propyl (e.g., n-propyl and isopropyl), butyl (e.g., n-butyl, isobutyl, sec-butyl, tert-butyl), pentyl groups (e.g., n-pentyl, isopentyl, neopentyl, tert-pentyl), hexyl groups, and the like. In various embodiments, an alkyl group can have 1 to 40 carbon atoms (i.e., $C_1$-$C_{40}$ alkyl group), for example, 1-30 carbon atoms (i.e., $C_1$-$C_{30}$ alkyl group). In some embodiments, an alkyl group can have 1 to 6 carbon atoms, and can be referred to as a "lower alkyl group." Examples of lower alkyl groups include methyl, ethyl, propyl (e.g., n-propyl and isopropyl), and butyl groups (e.g., n-butyl, isobutyl, sec-butyl, tert-butyl). In some embodiments, alkyl groups can be substituted as described herein. An alkyl group is generally not substituted with another alkyl group, an alkenyl group, or an alkynyl group.

As used herein, "alkenyl" refers to a straight-chain or branched alkyl group having one or more carbon-carbon double bonds. Examples of alkenyl groups include ethenyl, propenyl, butenyl, pentenyl, hexenyl, butadienyl, pentadienyl, hexadienyl groups, and the like. The one or more carbon-carbon double bonds can be internal (such as in 2-butene) or terminal (such as in 1-butene). In various embodiments, an alkenyl group can have 2 to 40 carbon atoms (i.e., $C_2$-$C_{40}$ alkenyl group), for example, 2 to 20 carbon atoms (i.e., $C_2$-$C_{20}$ alkenyl group). In some embodiments, alkenyl groups can be substituted as described herein. An alkenyl group is generally not substituted with another alkenyl group, an alkyl group, or an alkynyl group.

As used herein, a "fused ring" or a "fused ring moiety" refers to a polycyclic ring system having at least two rings where at least one of the rings is aromatic and such aromatic ring (carbocyclic or heterocyclic) has a bond in common with at least one other ring that can be aromatic or non-aromatic, and carbocyclic or heterocyclic. These polycyclic ring systems can be highly p-conjugated and optionally substituted as described herein.

As used herein, "heteroatom" refers to an atom of any element other than carbon or hydrogen and includes, for example, nitrogen, oxygen, silicon, sulfur, phosphorus, and selenium.

As used herein, "aryl" refers to an aromatic monocyclic hydrocarbon ring system or a polycyclic ring system in which two or more aromatic hydrocarbon rings are fused (i.e., having a bond in common with) together or at least one aromatic monocyclic hydrocarbon ring is fused to one or more cycloalkyl and/or cycloheteroalkyl rings. An aryl group can have 6 to 24 carbon atoms in its ring system (e.g., $C_6$-$C_{24}$ aryl group), which can include multiple fused rings. In some embodiments, a polycyclic aryl group can have 8 to 24 carbon atoms. Any suitable ring position of the aryl group can be covalently linked to the defined chemical structure. Examples of aryl groups having only aromatic carbocyclic ring(s) include phenyl, 1-naphthyl (bicyclic), 2-naphthyl (bicyclic), anthracenyl (tricyclic), phenanthrenyl (tricyclic), pentacenyl (pentacyclic), and like groups. Examples of polycyclic ring systems in which at least one aromatic carbocyclic ring is fused to one or more cycloalkyl and/or cycloheteroalkyl rings include, among others, benzo derivatives of cyclopentane (i.e., an indanyl group, which is a 5, 6-bicyclic cycloalkyl/aromatic ring system), cyclohexane (i.e., a tetrahydronaphthyl group, which is a 6, 6-bicyclic cycloalkyl/aromatic ring system), imidazoline (i.e., a benzimidazolinyl group, which is a 5, 6-bicyclic cycloheteroalkyl/aromatic ring system), and pyran (i.e., a chromenyl group, which is a 6, 6-bicyclic cycloheteroalkyl/aromatic ring system). Other examples of aryl groups include benzodioxanyl, benzodioxolyl, chromanyl, indolinyl groups, and the like. In some embodiments, aryl groups can be substituted as described herein. In some embodiments, an aryl group can have one or more halogen substituents, and can be referred to as a "haloaryl" group. Perhaloaryl groups, i.e., aryl groups where all of the hydrogen atoms are replaced with halogen atoms (e.g., —$C_6F_5$), are included within the definition of "haloaryl." In certain embodiments, an aryl group is substituted with another aryl group and can be referred to as a biaryl group. Each of the aryl groups in the biaryl group can be substituted as disclosed herein.

As used herein, "heteroaryl" refers to an aromatic monocyclic ring system containing at least one ring heteroatom selected from oxygen (O), nitrogen (N), sulfur (S), silicon (Si), and selenium (Se) or a polycyclic ring system where at least one of the rings present in the ring system is aromatic and contains at least one ring heteroatom. Polycyclic heteroaryl groups include those having two or more heteroaryl rings fused together, as well as those having at least one monocyclic heteroaryl ring fused to one or more aromatic carbocyclic rings, non-aromatic carbocyclic rings, and/or non-aromatic cycloheteroalkyl rings. A heteroaryl group, as a whole, can have, for example, 5 to 24 ring atoms and contain 1-5 ring heteroatoms (i.e., 5-20 membered heteroaryl group). The heteroaryl group can be attached to the defined chemical structure at any heteroatom or carbon atom that results in a stable structure. Generally, heteroaryl rings do not contain O—O, S—S, or S—O bonds. However, one or more N or S atoms in a heteroaryl group can be oxidized (e.g., pyridine N-oxide thiophene S-oxide, thiophene S, S-dioxide). Examples of heteroaryl groups include, for example, the 5- or 6-membered monocyclic and 5-6 bicyclic ring systems shown below:

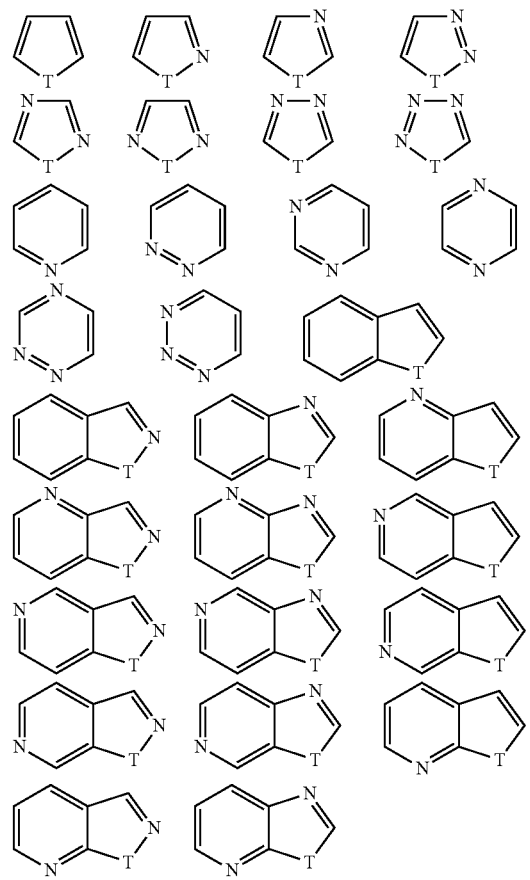

where T is O, S, NH, N-alkyl, N-aryl, N-(arylalkyl) (e.g., N-benzyl), $SiH_2$, SiH(alkyl), Si(alkyl)$_2$, SiH(arylalkyl), Si(arylalkyl)$_2$, or Si(alkyl)(arylalkyl). Examples of such heteroaryl rings include pyrrolyl, furyl, thienyl, pyridyl, pyrimidyl, pyridazinyl, pyrazinyl, triazolyl, tetrazolyl, pyrazolyl, imidazolyl, isothiazolyl, thiazolyl, thiadiazolyl, isoxazolyl, oxazolyl, oxadiazolyl, indolyl, isoindolyl, benzofuryl, benzothienyl, quinolyl, 2-methylquinolyl, isoquinolyl, quinoxalyl, quinazolyl, benzotriazolyl, benzimidazolyl, benzothiazolyl, benzisothiazolyl, benzisoxazolyl, benzoxadiazolyl, benzoxazolyl, cinnolinyl, 1H-indazolyl, 2H-indazolyl, indolizinyl, isobenzofuyl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyridazinyl, thienothiazolyl, thienoxazolyl, thienoimidazolyl groups, and the like. Further examples of heteroaryl groups include 4,5,6,7-tetrahydroindolyl, tetrahydroquinolinyl, benzothienopyridinyl, benzofuropyridinyl groups, and the like. In some embodiments, heteroaryl groups can be substituted as described herein.

The methods described herein utilize donor materials having temperature dependent aggregation properties. Temperature dependent aggregation of a donor material can be evaluated using any number of analytical methods known to those of skill in the art including, but not limited to, measuring lighting scattering of samples containing the donor material in a test solvent at various temperatures and measuring changes in absorption of samples containing the donor material in a test solvent at various temperatures. Temperature dependent aggregation of a donor material can also be evaluated using in situ X-ray diffraction of the donor material at different temperatures.

Polymers exhibiting temperature dependent aggregation typically display the highest degree of aggregation at elevated temperature, e.g., >60° C. In contrast, the donor materials described herein exhibit strong temperature dependent aggregation at about 20-30° C. Without wishing to be bound by theory, it is believed that this property, at least in part, results in the formation of bulk heterojunction materials comprising a plurality of highly crystalline domain sizes on the order of, e.g., 10 to about 50 nm, which yields a substantial improvement in optoelectronic properties of the material.

Dilute solutions of donor materials provided herein can exhibit significant bathochromic shifts in absorption when the temperature of the solution is varied. For example, a dilute solution of PffBT4T-2OD (0.02 mg/mL) in 1,2-dichlorobenzene absorbs strongly at 530 nm at a temperature of about 85° C. However, upon cooling, the absorption spectrum experiences a dramatic bathochromic shift of about 100 to about 150 nm. In certain embodiments, the donor materials described herein can exhibit a bathochromic shift in their absorption spectrum when measured in dilute solution in a solvent, such as chlorobenzene, 1,2-dichlorobenzene, and combinations thereof, of more than about 40 nm, more than about 50 nm, more than about 60 nm, more than about 70 nm, more than about 80 nm, more than about 90 nm, more than about 100 nm, more than about 110 nm, more than about 120 nm, more than about 130 nm, more than about 140 nm, or more than about 150 nm. In other embodiments, the donor materials described herein can exhibit a bathochromic shift in their absorption spectrum when measured in dilute solution in a solvent, such as chlorobenzene, 1,2-dichlorobenzene, and combinations thereof, of between about 40 nm to about 170 nm, about 40 nm to about 160 nm, about 40 nm to about 150 nm, about 40 nm to about 140 nm, about 40 nm to about 130 nm, about 40 nm to about 120 nm, about 40 nm to about 110 nm, about 40 nm to about 100 nm, about 40 nm to about 90 nm, about 40 nm to about 80 nm, about 40 nm to about 70 nm, or about 40 nm to about 60 nm.

In certain embodiments, provided herein is a donor solution comprising the donor solvent and the donor material, wherein the donor material exhibits a peak optical absorption spectrum in the film state that is red shifted by about 40 nm to about 150 nm as compared with the donor material in the donor solution. In certain embodiments, the donor material exhibits a peak optical absorption spectrum in the film state that is red shifted by at least about 50 nm, about 60 nm, about 70 nm, about 80 nm, about 90 nm, about 100 nm, about 110 nm, about 120 nm, about 130 nm, about 140 nm, or about 150 nm relative to the same donor material in the solution state. The peak optical absorption of PffBT-T3(1, 2)-2, PffBT4T-2OD, and PffBT4T-C9C13 in the film state, occur at about 650 nm, about 700 nm and about 700 nm, respectively.

One particular class of donor materials that exhibit temperature induced aggregation properties are polythiophene containing polymers, including terthiophene-based polymers and quarterthiophene-based polymers. It has been determined that the temperature dependent aggregation of these polymers can be further enhanced by incorporation of one or more bulky β-branched alkyl groups and/or fluorine groups at certain portions of the thiophene containing polymer. An exemplary β-branched alkyl substituted thiophene is depicted below:

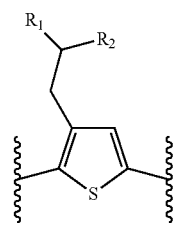

wherein $R_1$ and $R_2$ are independently $(C_5-C_{30})$alkyl. $R_1$ and $R_2$ can independently be branched chained alkyl groups or straight chain alkyl groups.

Each repeating unit of the thiophene-based polymer donor material can include 1, 2, 3, 4, 5, 6, 7 or 8 β-branched alkyl substituted thiophenes and/or 1, 2, 3, 4, 5, 6, 7 or 8 fluorides covalently bonded to one or more thiophenes and/or other aromatic moieties present in the repeating unit of the thiophene-based polymer.

In certain embodiments, the donor material can be represented by a polymer selected from the group consisting of:
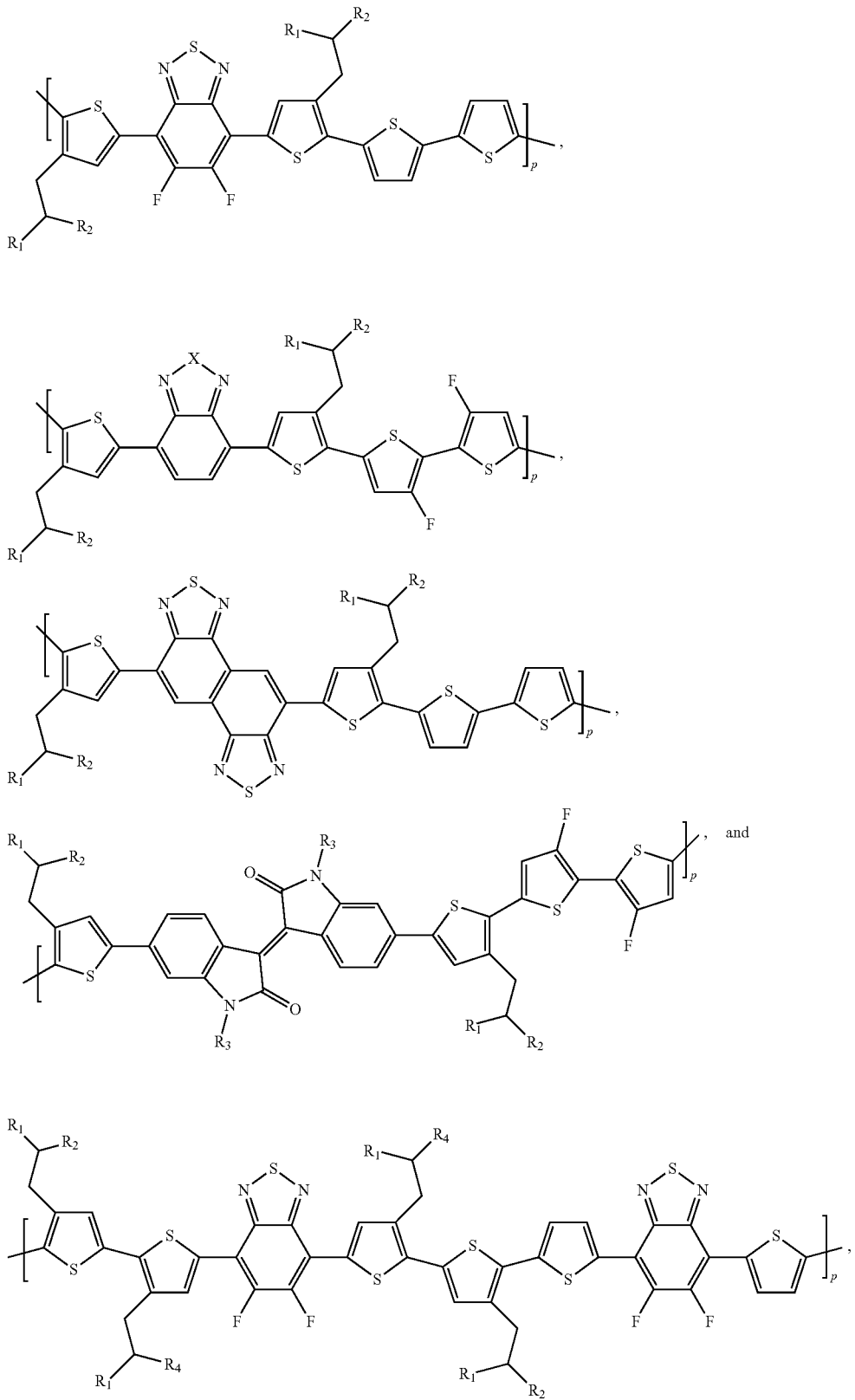

wherein p is a whole number selected from 20-500; X is S or $N(C_1\text{-}C_{12})$alkyl; each of $R_1$, $R_2$, and $R_4$ is independently $(C_5\text{-}C_{30})$alkyl; and $R_3$ is $(C_4\text{-}C_{12})$alkyl. $R_1$, $R_2$, and $R_4$ can be independently selected from branched chain alkyl groups and straight chain alkyl groups.

In certain embodiments, p is about 20 to about 450; about 20 to about 400; about 20 to about 350; about 20 to about 300; about 20 to about 250; about 20 to about 200; about 20 to about 150; about 20 to about 100; about 20 to about 90; about 30 to about 90; about 40 to about 90; about 40 to about 80; about 40 to about 70; about 40 to about 60; about 30 to about 60; about 20 to about 60; about 30 to about 50; or about 20 to about 40.

In instances where X is $N(C_1\text{-}C_{12})$alkyl, the donor material can be represented by the following polymer:

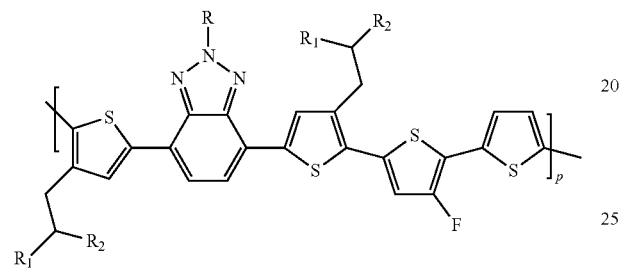

wherein R represents an alkyl having between 1 and 12 carbon atoms. In certain embodiments, R is $(C_1\text{-}C_{11})$alkyl; $(C_1\text{-}C_{10})$alkyl; $(C_1\text{-}C_9)$alkyl; $(C_1\text{-}C_8)$alkyl; $(C_1\text{-}C_7)$alkyl; $(C_1\text{-}C_6)$alkyl; $(C_1\text{-}C_5)$alkyl; or $(C_1\text{-}C_4)$alkyl.

In certain embodiments, each of $R_1$, $R_2$, and $R_4$ is independently $(C_5\text{-}C_{24})$alkyl, $(C_5\text{-}C_{22})$alkyl, $(C_5\text{-}C_{20})$alkyl, $(C_5\text{-}C_{18})$alkyl, $(C_5\text{-}C_{16})$alkyl, $(C_5\text{-}C_{14})$alkyl, $(C_5\text{-}C_{12})$alkyl, $(C_5\text{-}C_{10})$alkyl, $(C_6\text{-}C_{12})$alkyl, or $(C_8\text{-}C_{12})$alkyl.

In certain embodiments, $R_3$ is $(C_4\text{-}C_{12})$alkyl; $(C_4\text{-}C_{11})$alkyl; $(C_4\text{-}C_{10})$alkyl; $(C_5\text{-}C_{10})$alkyl; $(C_6\text{-}C_{10})$alkyl; $(C_6\text{-}C_9)$alkyl; $(C_7\text{-}C_9)$alkyl; or $(C_6\text{-}C_8)$alkyl.

In certain embodiments the donor material can be represented by a polymer selected from the group consisting of:

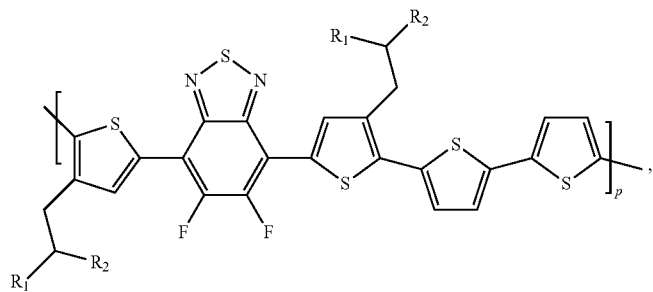

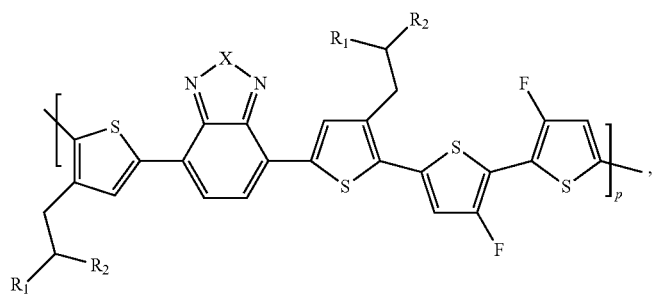

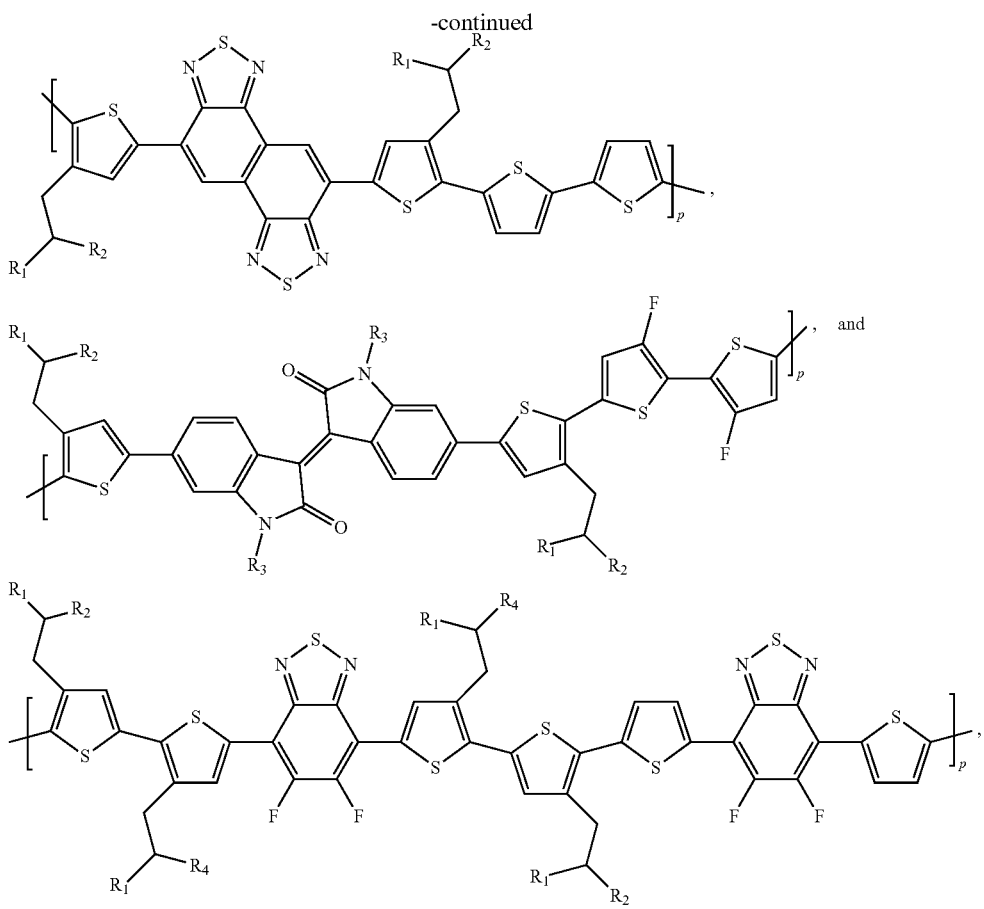
wherein p is a whole number selected from 20-100; X is S or N(C$_2$-C$_6$)alkyl; each of R$_1$, R$_2$, and R$_4$ is independently (C$_6$-C$_{14}$)alkyl; and R$_3$ is (C$_6$-C$_{10}$)alkyl.
In certain embodiments, the donor material can be represented by a polymer selected from the group consisting of:
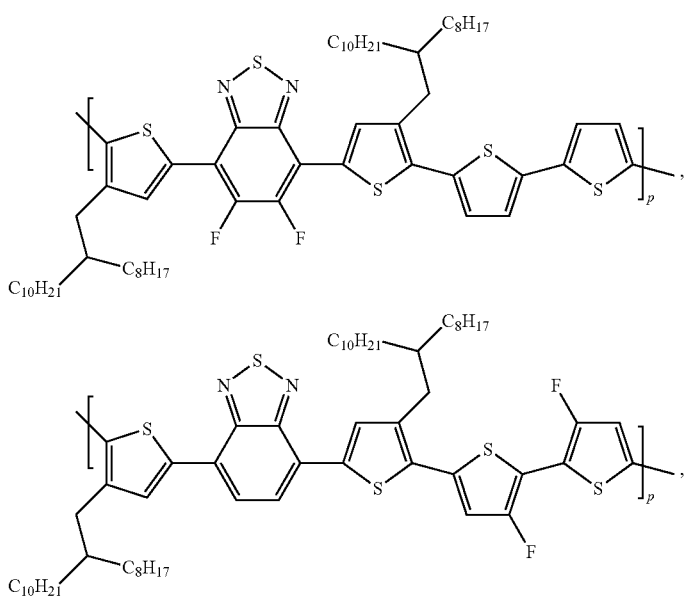

-continued
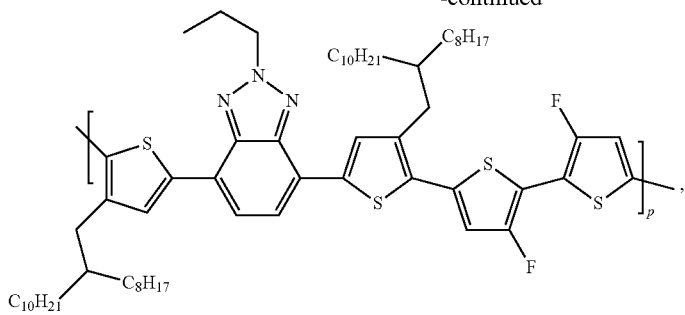
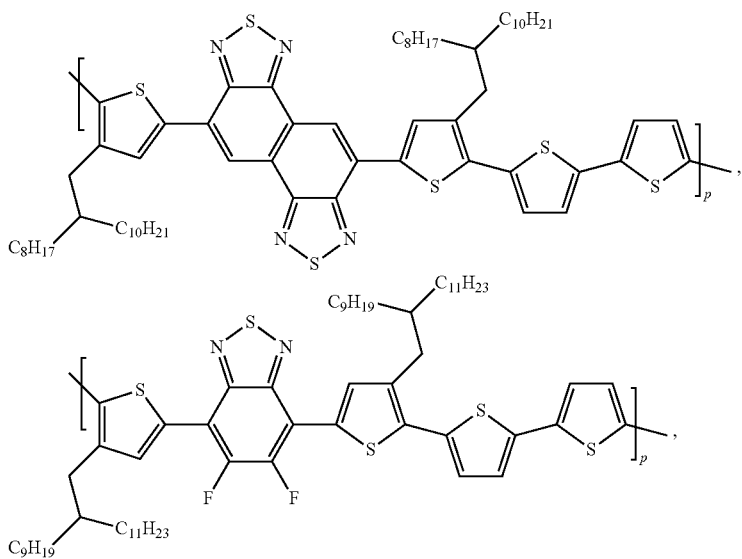
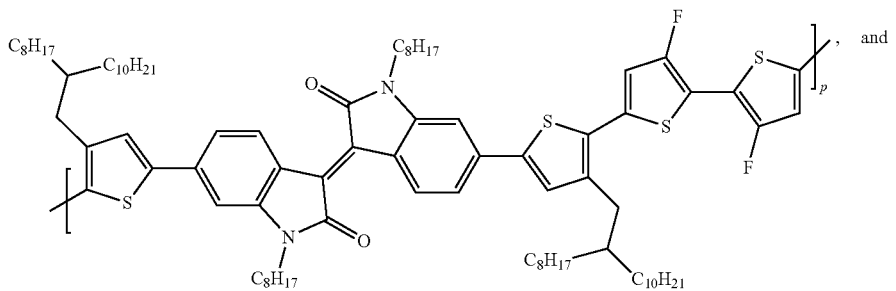
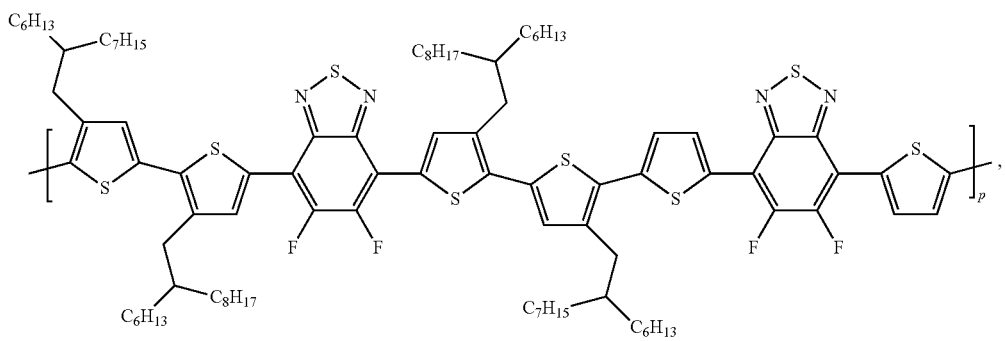
wherein p is about 20 to about 100.

In certain embodiments, the donor material is selected from:

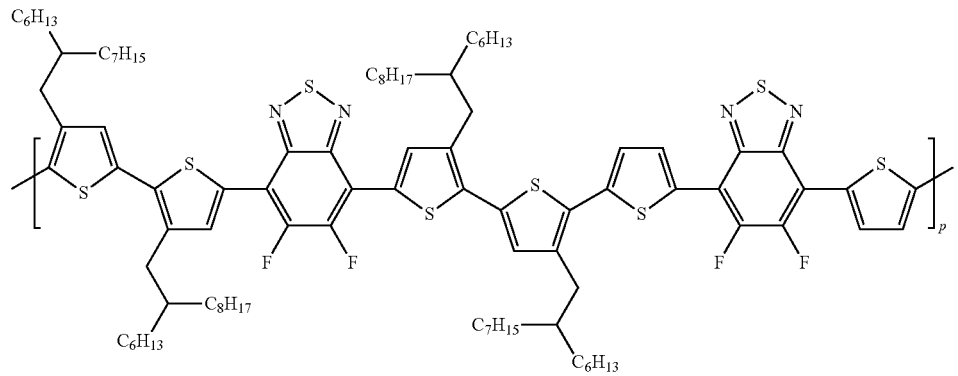

PffBT-T3(1,2)-2

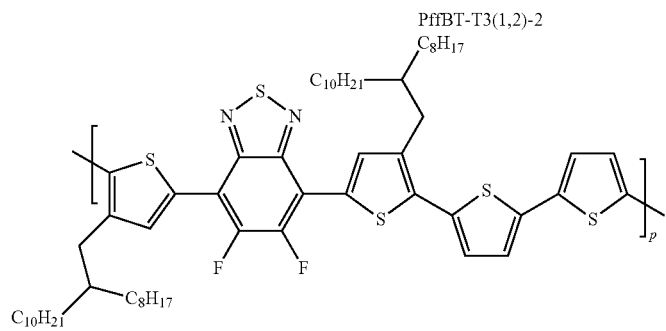

PffBT4T-2OD

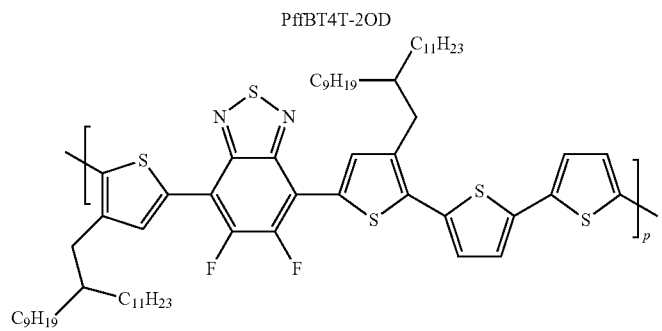

PffBT4T-C9C13 wherein p is about 20 to about 100.

In certain embodiments, the donor material can be represented by a polymer as described herein, wherein the polymer has an average molecular weight of about 20 kDa to about 120 kDa; about 20 kDa to about 110 kDa; about 20 kDa to about 100 kDa; about 20 kDa to about 90 kDa; about 30 kDa to about 90 kDa; about 40 kDa to about 90 kDa; about 30 kDa to about 80 kDa; about 30 kDa to about 70 kDa; about 30 kDa to about 60 kDa; about 30 kDa to about 50 kDa; or about 20 kDa to about 50 kDa.

PffBT-T3(1,2)-2 can have a Mn of about 60 to about 70 kDa; and a Mw of about 105 to about 115 kDa. PffBT4T-2OD can have a Mn of about 40 to about 50 kDa; and a Mw of about 90 to about 100 kDa. PffBT4T-C9C13 can have a Mn of about 65 to about 75 kDa; and a Mw of about 105 to about 115 kDa. In certain embodiments, For PffBT-T3(1,2)-2 has a Mn of about 66.1 kDa; and a Mw of about 109.6 kDa. In certain embodiments, PffBT4T-2OD has a Mn of about 43.5 kDa; and a Mw of about 93.7 kDa. In certain embodiments, PffBT4T-C9C13 has a Mn of about 68.4 kDa; and a Mw of about 111 kDa.

The donor solution comprises the donor solvent and the donor material described herein. The donor material is dissolved in a donor solvent in which it is substantially soluble when heated above room temperature. The donor solvent can be 1,2-dichlorobenzene, 1,3-dichlorobenzene, 1,2,4-trichlorobenzene, chlorobenzene, 1,2,4-trimethylbenzene, chloroform and combinations thereof. In certain embodiments, the donor solution further comprises one or more solvent additives, such as 1-chloronaphthalene and 1,8-octanedithiol, 1,8-diiodooctane, and combinations thereof. In certain embodiments, the donor solvent is at least one of 1,2-dichlorobenzene and chlorobenzene and optionally contains the solvent additive 1,8-diiodooctane. In instances where the donor solvent further comprises a solvent additive, the solvent additive can be present between about 0.1% to about 8% (v/v); about 0.1% to about 6% (v/v); about 0.1% to about 4% (v/v); or about 0.1% to about 2% (v/v) in the donor solvent.

In preparation for depositing the donor material on a substrate, the donor solution comprising the donor solvent and donor material can first be prepared. When the donor solvent (e.g., in chlorobenzene) is at a temperature of about 90° C. to about °120, the donor material can be present in the donor solution at a concentration between about 0.1 mg/mL and about 40 mg/mL; 0.1 mg/mL and about 40 mg/mL; 5 mg/mL and about 40 mg/mL; 10 mg/mL and about 40 mg/mL; 15 mg/mL and about 40 mg/mL; 20 mg/mL and about 40 mg/mL; 20 mg/mL and about 35 mg/mL; 25 mg/mL and about 35 mg/mL; 1 mg/mL and about 15 mg/mL; 3 mg/mL and about 15 mg/mL; or 5 mg/mL and about 15 mg/mL. In other embodiments, when the donor solvent is at a temperature of about 90° C. to about °120, the donor material can be present in the donor solution at a concentration of less than about 50 mg/mL, about 45 mg/mL, about 40 mg/mL, about 35 mg/mL, about 30 mg/mL, or about 25 mg/mL.

When the donor solvent is at a temperature of about 90° C. to about °120, PffBT-T3(1,2)-2, can be present at a concentration up to about 30 mg/mL in chlorobenzene and up to about 35 mg/mL in 1,2-dichlorobenzne; PffBT4T-2OD can be present at a concentration up to about 25 mg/mL in chlorobenzene and up to about 30 mg/mL in 1,2-dichlorobenzne; and PffBT4T-C9C13 can be present at a concentration up to about 20 mg/mL in chlorobenzene and up to about 25 mg/mL in 1,2-dichlorobenzene.

Before depositing the donor solution comprising the donor solvent and the donor material on the substrate, the donor solution can be heated to ensure that the donor material is in a substantially disaggregated state. In certain embodiments, the donor solution comprising the donor solvent and the donor material is heated to about 60° C. to about 150° C.; about 70° C. to about 150° C.; about 80° C. to about 150° C.; about 80° C. to about 140° C.; about 80° C. to about 130° C.; about 90° C. to about 130° C.; about 90° C. to about 120° C.; or about 80° C. to about 110° C.

The substrate can optionally be heated prior to deposition of the donor solution comprising the donor solvent and the donor material. In certain embodiments, the substrate is heated to about 60° C. to about 150° C.; about 70° C. to about 150° C.; about 80° C. to about 150° C.; about 80° C. to about 140° C.; about 80° C. to about 130° C.; about 90° C. to about 130° C.; about 90° C. to about 120° C.; or about 80° C. to about 110° C.

The donor solution comprising the donor solvent and the donor material can be deposited on the substrate using any method known to those of skill in the art including, but not limited to, spin coating, printing, print screening, spraying, painting, doctor-blading, slot-die coating, and dip coating.

Once the donor solution comprising the donor solvent and the donor material is deposited, the donor solvent can be removed (e.g., at atmospheric pressure and temperature or under reduced pressure and/or elevated temperature) thereby forming the thin film comprising the donor material.

The thin film comprising the donor material having temperature dependent aggregation prepared using the methods described herein can have small domains, e.g., having an average longest cross-sectional length of about 10 to about 50 nm, which are substantially crystalline. In certain embodiments, the substantially crystalline domains have an average longest cross-sectional length of about 20 to about 40 nm; about 15 to about 30 nm or about 30 to about 50 nm in length.

In a certain embodiments, the acceptor material is a fullerene derivative selected from the group consisting of:

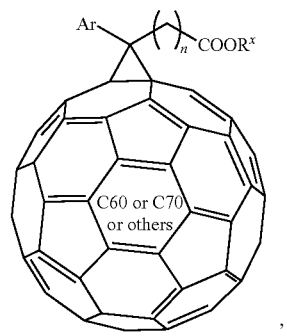

,

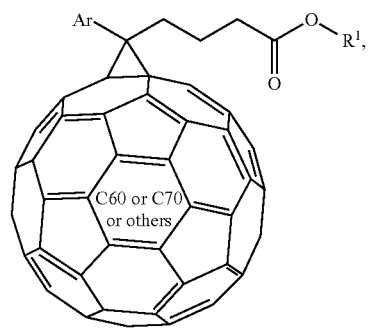

,

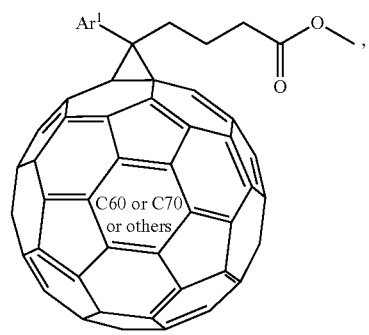

,

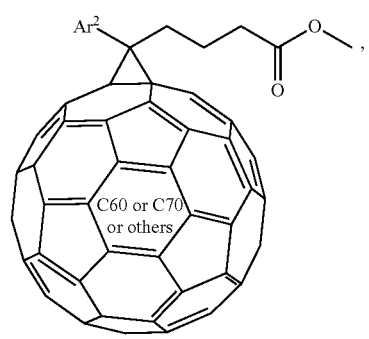

,

-continued
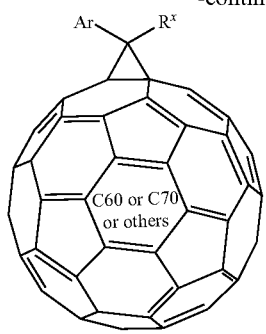
,
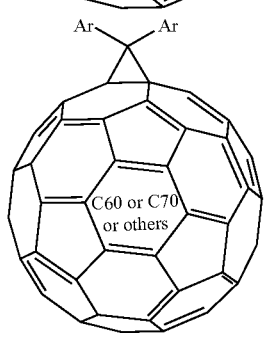
,
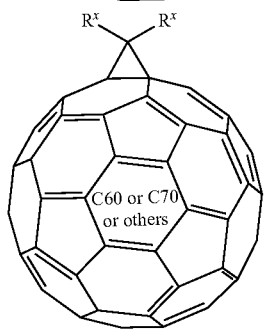
,
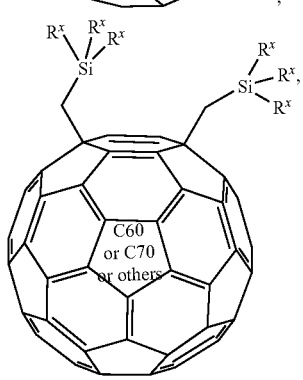
,
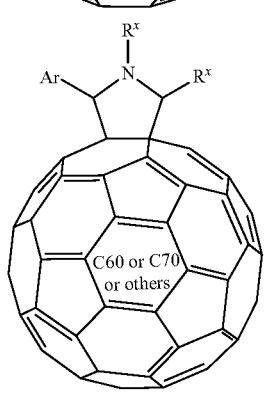
,
-continued
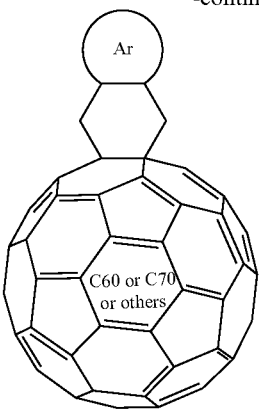
,
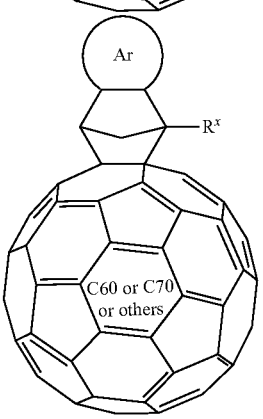
,
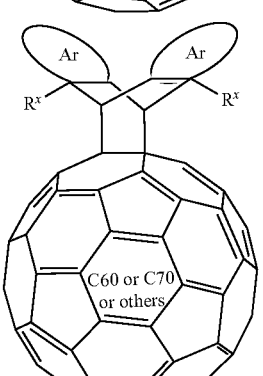
, and
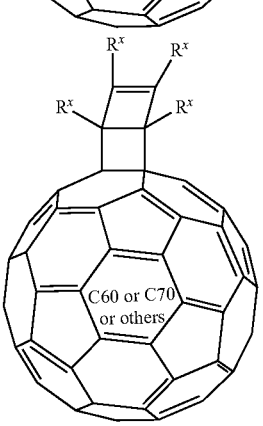
,
wherein each n=1, 2, 3, 4, 5, or 6;
each Ar is independently selected from the group consisting of monocyclic, bicyclic, and polycyclic arylene, and monocyclic, bicyclic, and polycyclic heteroarylene, wherein each Ar may contain one to five of said arylene or heteroarylene each of which may be fused or linked;

each $R^x$ is independently selected from the group consisting of Ar, straight-chain, branched, and cyclic alkyl with 2-40 C atoms, wherein one or more non-adjacent C atoms are optionally replaced by —O—, —S—, —C(O)—, —C(O—)—O—, —O—C(O)—, —O—C(O)—O—, —CR⁰=CR⁰⁰—, or —C≡C—, and wherein one or more H atoms are optionally replaced by F, Cl, Br, I, or CN or denote aryl, heteroaryl, aryloxy, heteroaryloxy, arylcarbonyl, heteroarylcarbonyl, arylcarbonyloxy, heteroarylcarbonyloxy, aryloxycarbonyl, or heteroaryloxycarbonyl having 4 to 30 ring atoms unsubstituted or substituted by one or more non-aromatic groups, wherein $R^0$ and $R^{00}$ are independently a straight-chain, branched, or cyclic alkyl group;

each $R^1$ is independently selected from the group consisting of straight-chain, branched, and cyclic alkyl with 2-40 C atoms, wherein one or more non-adjacent C atoms are optionally replaced by —O—, —S—, —C(O)—, —C(O—)—O—, —O—C(O)—, —O—C(O)—O—, —CR⁰=CR⁰⁰—, or —C≡C—, and wherein one or more H atoms are optionally replaced by F, Cl, Br, I, or CN or denote aryl, heteroaryl, aryloxy, heteroaryloxy, arylcarbonyl, heteroarylcarbonyl, arylcarbonyloxy, heteroarylcarbonyloxy, aryloxycarbonyl, or heteroaryloxycarbonyl having 4 to 30 ring atoms unsubstituted or substituted by one or more non-aromatic groups, wherein the number of carbon that $R^1$ contains is larger than 1, wherein $R^0$ and $R^{00}$ are independently a straight-chain, branched, or cyclic alkyl group;

each $Ar^1$ is independently selected from the group consisting of monocyclic, bicyclic and polycyclic heteroaryl groups, wherein each $Ar^1$ may contain one to five of said heteroaryl groups each of which may be fused or linked;

each $Ar^2$ is independently selected from aryl groups containing more than 6 atoms excluding H; and wherein the fullerene ball represents a fullerene selected from the group consisting of $C_{60}$, $C_{70}$, $C_{84}$, and other fullerenes.

In one embodiment, the fullerene is substituted by one or more functional groups selected from the group consisting of:

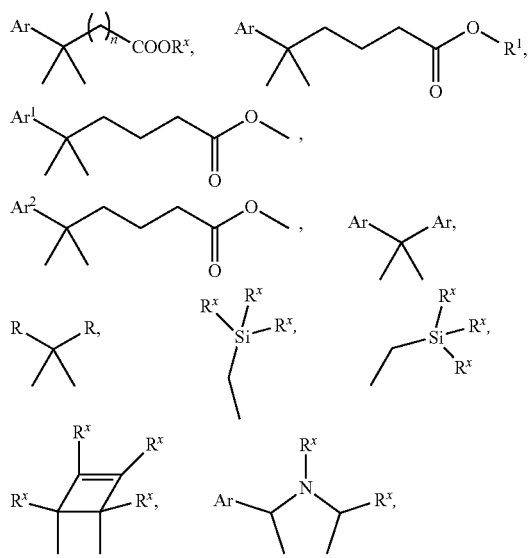

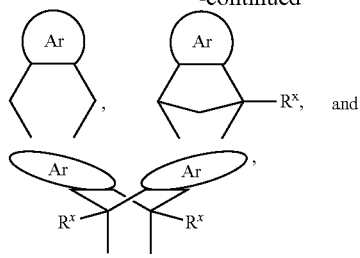

wherein each n is 1, 2, 3, 4, 5, or 6;

each Ar is independently selected from the group consisting of monocyclic, bicyclic, and polycyclic arylene, and monocyclic, bicyclic, and polycyclic heteroarylene, or may contain one to five such groups, either fused or linked;

each $R^x$ is independently selected from the group consisting of Ar, straight-chain, branched, and cyclic alkyl with 2-40 C atoms, wherein one or more non-adjacent C atoms are optionally replaced by —O—, —S—, —C(O)—, —C(O)—O—, —O—C(O)—, —O—C(O)—O—, —CR⁰=CR⁰⁰—, or —C≡C—, and wherein one or more H atoms are optionally replaced by F, Cl, Br, I, or CN or denote aryl, heteroaryl, aryloxy, heteroaryloxy, arylcarbonyl, heteroarylcarbonyl, arylcarbonyloxy, heteroarylcarbonyloxy, aryloxycarbonyl, or heteroaryloxycarbonyl having 4 to 30 ring atoms unsubstituted or substituted by one or more non-aromatic groups, wherein $R^0$ and $R^{00}$ are independently a straight-chain, branched, or cyclic alkyl group;

each $R^1$ is independently selected from the group consisting of straight-chain, branched, and cyclic alkyl with 2-40 C atoms, wherein one or more non-adjacent C atoms are optionally replaced by —O—, —S—, —C(O)—, —C(O)—O—, —O—C(O)—, —O—C(O)—O—, —CR⁰=CR⁰⁰—, or —C≡C—, and wherein one or more H atoms are optionally replaced by F, Cl, Br, I, or CN or denote aryl, heteroaryl, aryloxy, heteroaryloxy, arylcarbonyl, heteroarylcarbonyl, arylcarbonyloxy, heteroarylcarbonyloxy, aryloxycarbonyl, or heteroaryloxycarbonyl having 4 to 30 ring atoms unsubstituted or substituted by one or more non-aromatic groups, wherein the number of carbon that $R^1$ contains is larger than 1, wherein $R^0$ and $R^{00}$ are independently a straight-chain, branched, or cyclic alkyl group;

each R is independently selected from the group consisting of straight-chain, branched, and cyclic alkyl with 2-40 C atoms, wherein one or more non-adjacent C atoms are optionally replaced by —O—, —S—, —C(O)—, —C(O)—O—, —O—C(O)—, —O—C(O)—O—, —CR⁰=CR⁰⁰—, or —C≡C—, and wherein one or more H atoms are optionally replaced by F, Cl, Br, I, or CN or denote aryl, heteroaryl, aryloxy, heteroaryloxy, arylcarbonyl, heteroarylcarbonyl, arylcarbonyloxy, heteroarylcarbonyloxy, aryloxycarbonyl, or heteroaryloxycarbonyl having 4 to 30 ring atoms unsubstituted or substituted by one or more non-aromatic groups, wherein $R^0$ and $R^{00}$ are independently a straight-chain, branched, or cyclic alkyl group;

each $Ar^1$ is independently selected from the group consisting of monocyclic, bicyclic and polycyclic heteroaryl groups, wherein each $Ar^1$ may contain one to five of said heteroaryl groups each of which may be fused or linked;

each $Ar^2$ is independently selected from aryl groups containing more than 6 atoms excluding H; and wherein the fullerene ball represents a fullerene selected from the group consisting of $C_{60}$, $C_{70}$, $C_{84}$, and other fullerenes.

In some embodiments, the formulation is further characterized in that the fullerene is selected from the group consisting of:
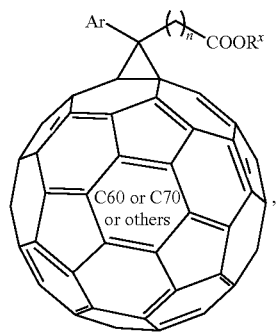,
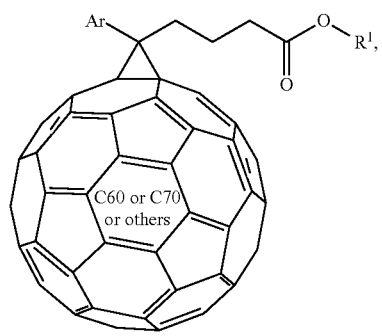,
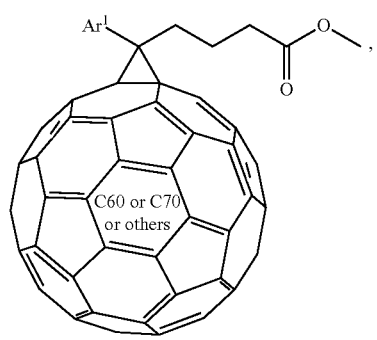,
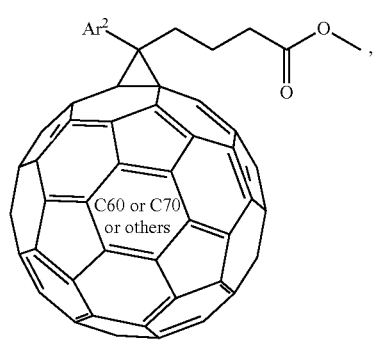,
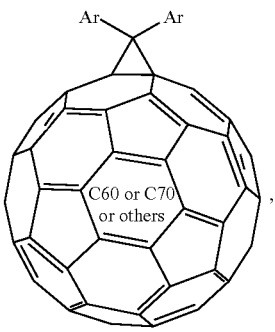,
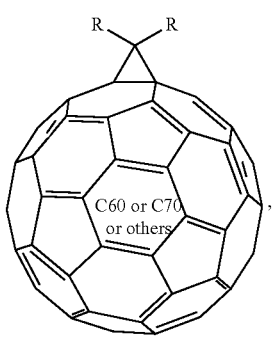,
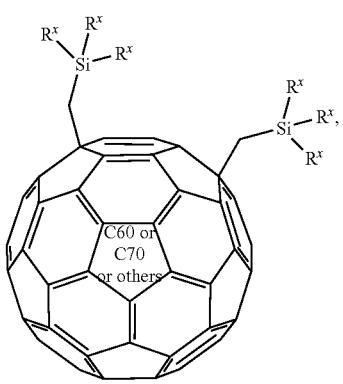,
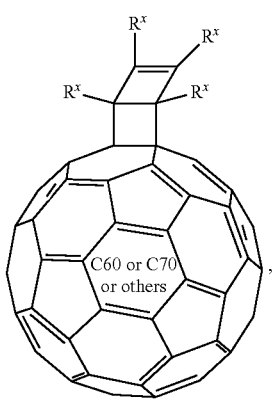, -continued

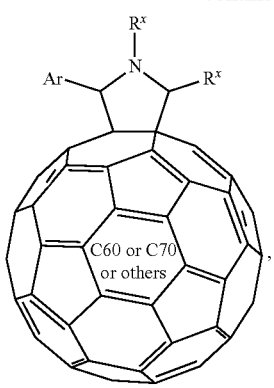

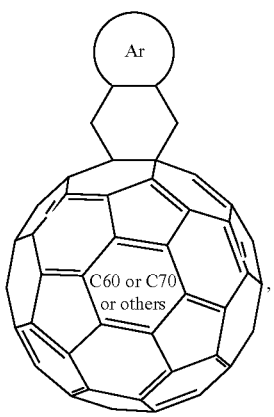

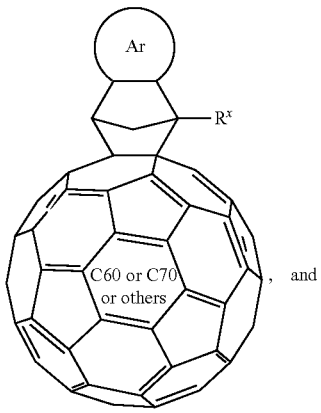, and

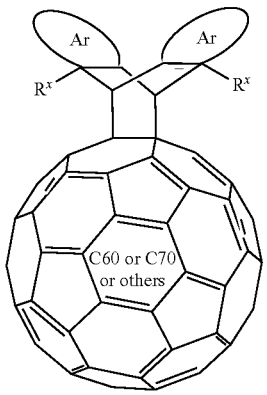

wherein each R is independently selected from the group consisting of straight-chain, branched, and cyclic alkyl with 2-40 C atoms, wherein one or more non-adjacent C atoms are optionally replaced by —O—, —S—, —C(O)—, —C(O)—O—, —O—C(O)—, —O—C(O)—O—, —CR$^o$═CR$^{oo}$—, or —C≡C—, and wherein one or more H atoms are optionally replaced by F, Cl, Br, I, or CN or denote aryl, heteroaryl, aryloxy, heteroaryloxy, arylcarbonyl, heteroarylcarbonyl, arylcarbonyloxy, heteroarylcarbonyloxy, aryloxycarbonyl, or heteroaryloxycarbonyl having 4 to 30 ring atoms unsubstituted or substituted by one or more non-aromatic groups, wherein R$^o$ and R$^{oo}$ are independently a straight-chain, branched, or cyclic alkyl group.

In some embodiments, the formulation is further characterized in that the fullerene is selected from the group consisting of:

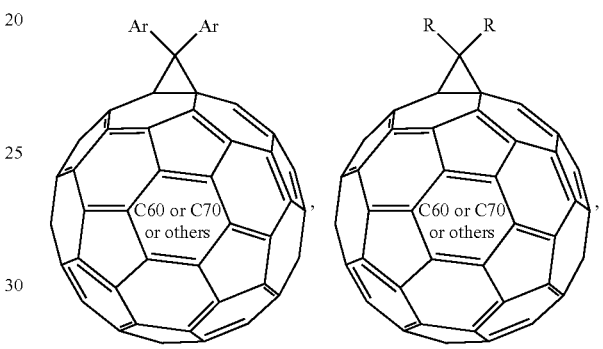

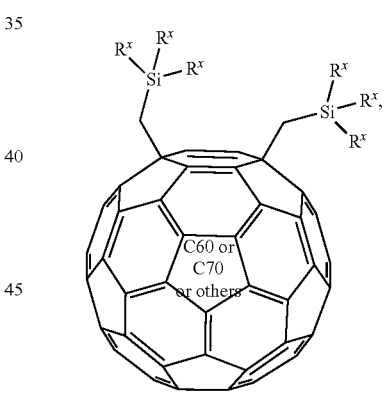

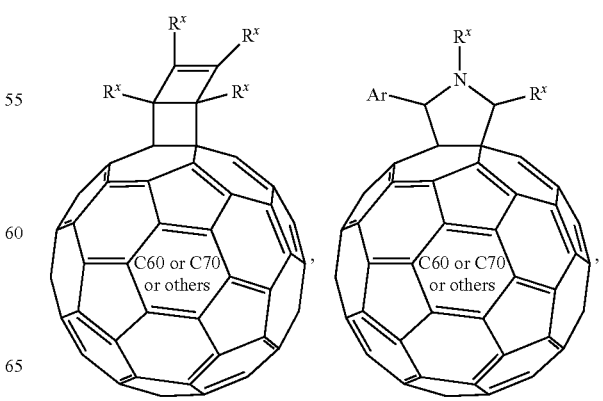

-continued

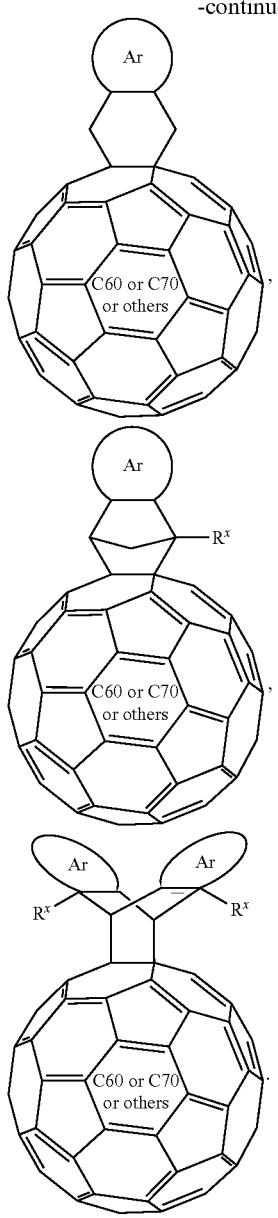
, and

In some embodiments, the formulation is further characterized in that the fullerene is selected from the group consisting of:

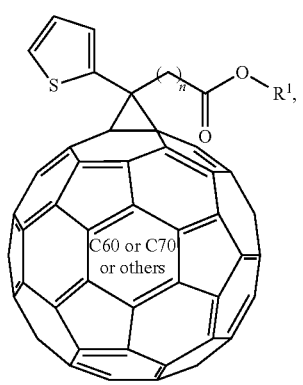

-continued

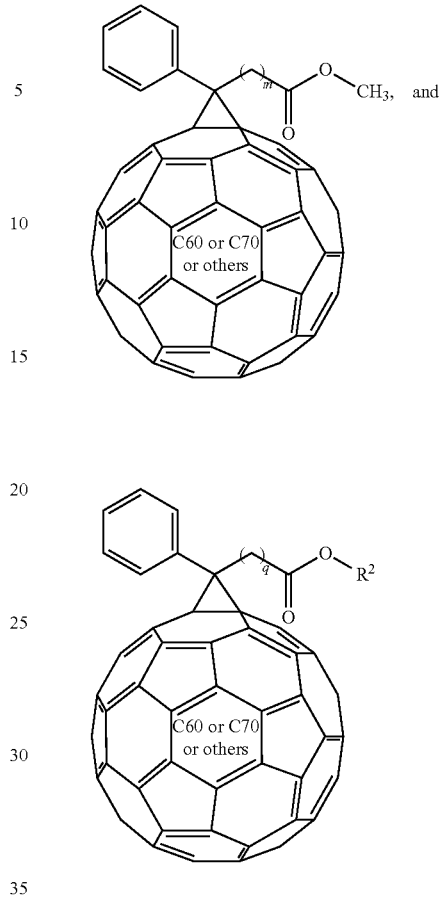

wherein each n is 1, 2, 3, 4, 5, or 6;
each m is 1, 2, 4, 5, or 6;
each q is 1, 2, 3, 4, 5, or 6;
each $R^1$ and $R^2$ is independently selected from the group consisting of $C_1$-$C_4$ straight and branched chain alkyl groups; and
wherein the fullerene ball represents a fullerene from the group consisting of $C_{60}$, $C_{70}$, $C_{84}$, and other fullerenes.

In some embodiments, the formulation is further characterized in that the fullerene is selected from the group consisting of:

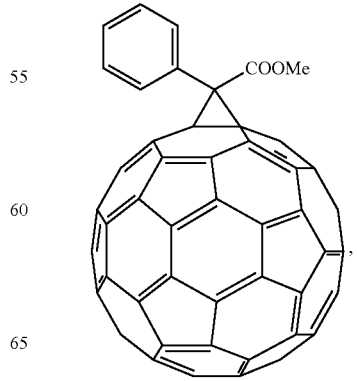

41
-continued
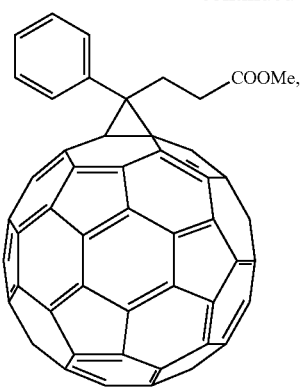
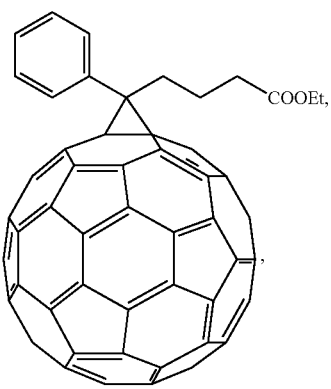
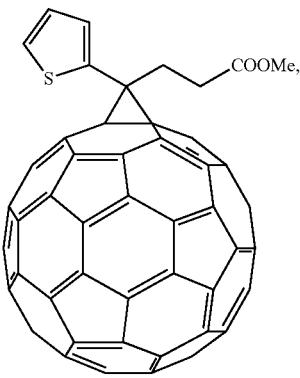
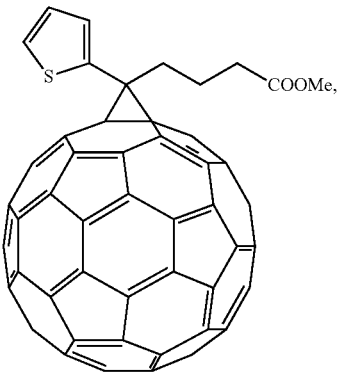
42
-continued
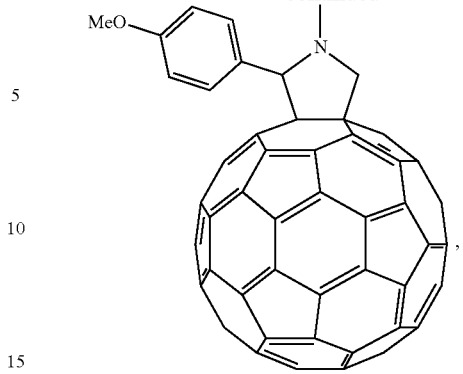
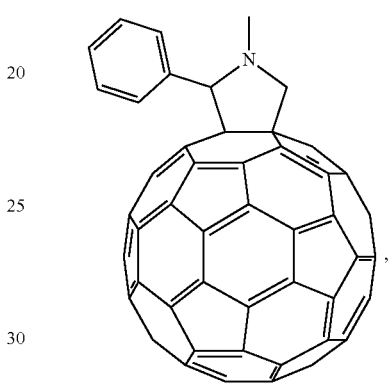
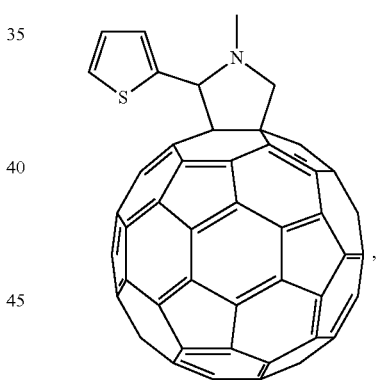
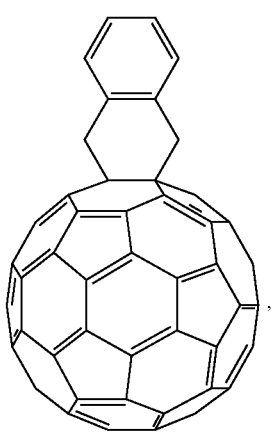

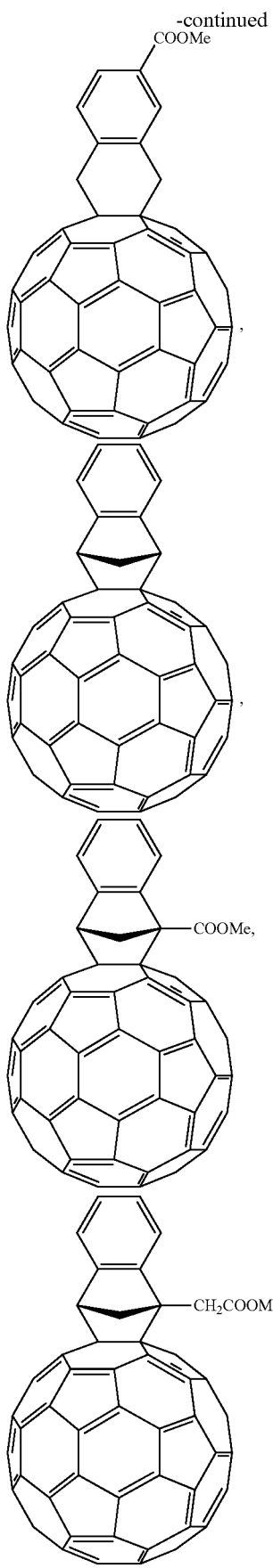

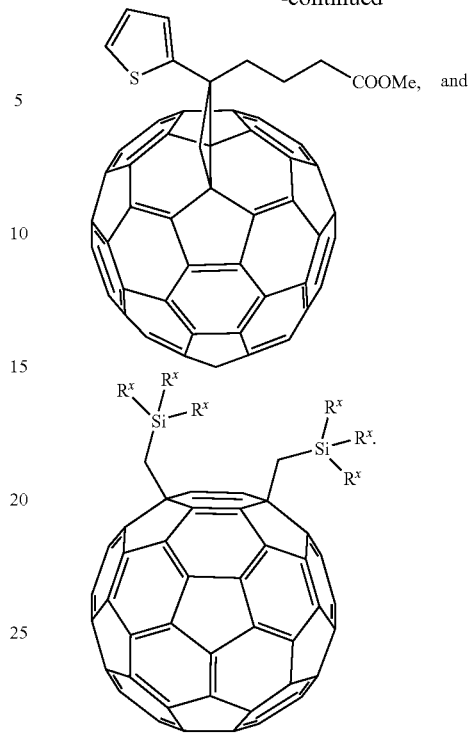

In certain embodiments, the acceptor material can be [6,6]-pheneyl $C_{71}$ butyric acid methyl ester ($PC_{71}BM$) represented by the following formula:

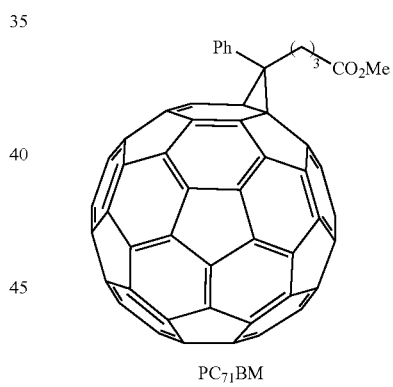

$PC_{71}BM$

The acceptor solution comprises the acceptor solvent and the acceptor material.

The acceptor solvent can be any solvent in which the donor material is substantially insoluble and in which the acceptor material is substantially soluble. The selection of the acceptor solvent is well within the skill of a person in the art. Exemplary acceptor solvents include, but are not limited to, chlorobenzene, 1,2-dichlorbenzene, chloroform, toluene, methanol, ethanol, 2-propanol, 1-butanol, dichloromethane and combinations thereof.

In certain embodiments, the donor material has a solubility in the acceptor solvent of less than about 1 mg/mL, 0.5 mg/mL, 0.4 mg/mL, 0.3 mg/mL, 0.2 mg/mL, 0.1 mg/mL, 0.09 mg/mL, 0.08 mg/mL, 0.07 mg/mL, 0.06 mg/mL, 0.05 mg/mL, 0.04 mg/mL, 0.03 mg/mL, 0.02 mg/mL, 0.01 mg/mL, 0.001 mg/mL, 0.0001 mg/mL, 0.00001 mg/mL, or is substantially insoluble in the acceptor solvent.

The concentration of the acceptor material in the acceptor solution can be varied in order to bulk heterojunction materials with the desired properties and the selection of which is well within the skill of a person in the art. In certain embodiments, the concentration of the acceptor material in the acceptor solution is less than about 100 mg/mL; about 90 mg/mL; about 80 mg/mL; about 70 mg/mL; about 60 mg/mL; about 50 mg/mL; about 40 mg/mL; about 30 mg/mL; about 20 mg/mL; or about 10 mg/mL. In other embodiments, the concentration of the acceptor material in the acceptor solution is between about 1 mg/mL and about 100 mg/mL; 10 mg/mL and about 100 mg/mL; 10 mg/mL and about 90 mg/mL; 10 mg/mL and about 80 mg/mL; 20 mg/mL and about 7 mg/mL; 20 mg/mL and about 60 mg/mL; 30 mg/mL and about 60 mg/mL; 40 mg/mL and about 60 mg/mL; or 50 mg/mL and about 60 mg/mL.

The acceptor solution comprising the acceptor solvent and the acceptor material can be deposited onto the surface of the thin film comprising the donor material using any method known to those skilled in the art. Exemplary deposition methods include, but are not limited to, spin coating, printing, print screening, spraying, painting, doctor-blading, slot-die coating, and dip coating.

After deposition of the acceptor solution, the acceptor solvent can be removed, e.g., under atmospheric pressure and temperature or reduced pressure and/or elevated temperature, thereby yielding the bulk heterojunction material.

The prepared bulk heterojunction material can be annealed under elevated temperature. In instances where the donor solution further comprises 1,8-diiodooctane, the step of annealing the bulk heterojunction material can be omitted.

In instances wherein the bulk heterojunction material is annealed, the annealing temperature is between about 80° C. and about 150° C.; about 80° C. and about 140° C.; about 80° C. and about 130° C.; 80° C. and about 120° C.; 80° C. and about 110° C.; or 90° C. and about 110° C.

In an exemplary embodiment, an organic electronic (OE) device comprises a coating or printing ink containing the formulation. Another exemplary embodiment is further characterized in that the OE device is an organic field effect transistor (OFET) device. Another exemplary embodiment is further characterized in that the OE device is an organic photovoltaic (OPV) device.

Formulations of the present teachings can exhibit semiconductor behavior such as optimized light absorption/charge separation in a photovoltaic device; charge transport/recombination/light emission in a light-emitting device; and/or high carrier mobility and/or good current modulation characteristics in a field-effect device. In addition, the present formulations can possess certain processing advantages such as solution-processability and/or good stability (e.g., air stability) in ambient conditions. The formulations of the present teachings can be used to prepare either p-type (donor or hole-transporting), n-type (acceptor or electron-transporting), or ambipolar semiconductor materials, which in turn can be used to fabricate various organic or hybrid optoelectronic articles, structures and devices, including organic photovoltaic devices and organic light-emitting transistors.

EXAMPLES

Example 1—Fabrication of SqP PffBT4T-2OD:$PC_{71}BM$ Solar Cell Devices

SqP PffBT4T-2OD:$PC_{71}BM$ solar cells were fabricated by starting with pre-patterned tin-doped indium oxide (ITO) coated substrates and cleaning them by successive sonication in detergent solution, deionized water, acetone and isopropanol for 30 min each. After drying in an oven, we treated the ITO substrates with an air plasma for 30 min. A solution of diethyl zinc (THF diluted) was then spin-coated onto the clean substrates in air at 5000 rpm for 30 s and a thin layer of zinc oxide (ZnO) of ~20 nm was formed. The ZnO-covered substrate was then baked at 185° C. for 30 min on a hotplate in air. PffBT4T-2OD solutions were prepared by dissolving 8 mg/mL of PffBT4T-2OD (Ray Energy, Corp.) in a mixed solution of ODCB:CB 1:1 v/v. For the DIO mixed solutions, the solutions were prepared by dissolving the same concentration of PffBT4T-2OD in a solvent mixture of ODCB:CB:DIO in a volume ratio of 50:50:3. The solutions were stirred at elevated temperatures (90-120° C.) for at least 1 hour prior to being spun onto the preheated ZnO covered substrates at spin speeds ranging from 600 to 1000 rpm for 40 s. After spin-coating, the PffBT4T-2OD films were kept in a nitrogen atmosphere for ~20 min prior to the deposition of $PC_{71}BM$. $PC_{71}BM$ solutions were prepared by dissolving $PC_{71}BM$ powder (Nano-C, or Ossila ltd. or Sigma Aldrich) in various solvents at various concentrations and stirring at room temperature for at least 30 minutes. The $PC_{71}BM$ concentrations for optimized PffBT4T-2OD:$PC_{71}BM$ devices were 60 mg/mL in ODCB or 23.4 mg/mL in $CHCl_3$. These solutions were then spin-cast on top of the PffBT4T-2OD layer from the previous step at room temperature (about 20 to about 25° C. or about 23° C.) 1000 rpm for 60 s. For optimized thermally annealed samples, the films were heated to 100° C. for 5 min on a hot plate under a nitrogen atmosphere. Anode deposition consisted of ~7 nm of $V_2O_5$ evaporated at rates below 1 Å/s followed by 100 nm of Al at ~1 Å/s. The resulting device active areas were 5.9 $mm^2$ for the small area devices and 100 $mm^2$ for large area devices.

For blend-cast (BC) bulk heterojunction (BHJ) PffBT4T-2OD:$PC_{71}BM$ devices, except for the active layer fabrication procedure, all the subsequent steps were identical to those for the SqP devices. All of our blend solutions had PffBT4T-2OD concentrations of 8 mg/mL in a mixed solution of ODCB:DCB:DIO (50:50:3 volume ratio). 1:1.2 polymer:fullerene weight ratios were used. The solutions were stirred at elevated temperatures (90-120° C.) for at least 1 hour prior to being spun onto the preheated ZnO covered substrates at spin speeds ranging from 600 to 1000 rpm for 40 s. The samples were brought into vacuum and were kept under vacuum for at least 10 min prior to being thermally annealed at 100° C. for 5 min.

Example 2—Fabrication of SqP PffBT4T-$C_9C_{13}$:$PC_{71}BM$ Solar Cell Devices

SqP PffBT4T-$C_9C_{13}$:$PC_{71}BM$ solar cells were fabricated by starting with prepatterned tin-doped indium oxide (ITO) coated substrates and cleaning them by successive sonication in detergent solution, deionized water, acetone and isopropanol for 30 min each. After drying in an oven, we treated the ITO substrates with an air plasma for 30 min. A solution of diethyl zinc (THF diluted) was then spin-coated onto the clean substrates in air at 5000 rpm for 30 s and a thin layer of zinc oxide (ZnO) of ~20 nm was formed. The ZnO-covered substrate was then baked at 185° C. for 30 min on a hotplate in air. PffBT4T-$C_9C_{13}$ solutions were prepared by dissolving 13 mg/mL of PffBT4T-$C_9C_{13}$ (home-synthesized) in a TMB. For the DIO mixed solutions, the solutions were prepared by dissolving the same concentration of PffBT4T-$C_9C_{13}$ in a solvent mixture of TMB:DIO in a volume ratio of 100:3. The solutions were stirred at elevated temperatures (90-120° C.) for at least 1 hour prior to being spun onto the preheated ZnO covered substrates at spin speeds ranging from 600 to 1000 rpm for 40 s. After spin-coating, the PffBT4T-$C_9C_{13}$ films were kept in a nitrogen atmosphere for ~20 min prior to the deposition of $PC_{71}BM$. $PC_{71}BM$ solutions were prepared by dissolving $PC_{71}BM$ powder (Nano-C, or Ossila ltd. or Sigma Aldrich) in various solvents at various concentrations and stirring at room temperature for at least 30 minutes. The $PC_{71}BM$ concentrations for optimized PffBT4T-$C_9C_{13}$:$PC_{71}BM$ devices were 40 mg/mL in ODCB. These solutions were then spin-cast on top of the PffBT4T-$C_9C_{13}$ layer from the previous step at 1000 rpm for 60 s. For optimized thermally annealed samples, the films were heated to 100° C. for 5 min on a hot plate under a nitrogen atmosphere. Anode deposition consisted of ~7 nm of $V_2O_5$ evaporated at rates below 1 Å/s followed by 100 nm of Al at ~1 Å/s. The resulting device active areas were 5.9 mm$^2$ for the small area devices and 100 mm$^2$ for large area devices.

For BC BHJ PffBT4T-$C_9C_{13}$:$PC_{71}BM$ devices, except for the active layer fabrication procedure, all the subsequent steps were identical to those for the SqP devices. All of our blend solutions had PffBT4T-$C_9C_{13}$ concentrations of 13 mg/mL in a mixed solution of TMB:DIO (100:3 volume ratio). 1:1.2 polymer:fullerene weight ratios were used. The solutions were stirred at elevated temperatures (90-120° C.) for at least 1 hour prior to being spun onto the preheated ZnO covered substrates at spin speeds ranging from 600 to 1000 rpm for 40 s. The samples were brought into vacuum and were kept under vacuum for at least 10 min prior to being thermally annealed at 100° C. for 5 min.

Example 3—Fabrication of SqP
PffBT-T3(1,2)-2:$PC_{71}BM$ Solar Cell Devices

SqP PffBT-T3(1,2)-2:$PC_{71}BM$ solar cells were fabricated by starting with prepatterned tin-doped indium oxide (ITO) coated substrates and cleaning them by successive sonication in detergent solution, deionized water, acetone and isopropanol for 30 min each. After drying in an oven, we treated the ITO substrates with an air plasma for 30 min. A solution of diethyl zinc (THF diluted) was then spin-coated onto the clean substrates in air at 5000 rpm for 30 s and a thin layer of zinc oxide (ZnO) of ~20 nm was formed. The ZnO-covered substrate was then baked at 185° C. for 30 min on a hotplate in air. PffBT-T3(1,2)-2 solutions were prepared by dissolving 9 mg/mL of PffBT-T3(1,2)-2 (home-synthesized) in a solvent mixture of ODCB:CB (1:1 volume ratio). The solutions were stirred at elevated temperatures (90-120° C.) for at least 1 hour prior to being spun onto the preheated ZnO covered substrates at spin speeds ranging from 600 to 1000 rpm for 40 s. After spin-coating, the PffBT-T3(1,2)-2 films were kept in a nitrogen atmosphere for ~20 min prior to the deposition of $PC_{71}BM$. $PC_{71}BM$ solutions were prepared by dissolving $PC_{71}BM$ powder (Nano-C, or Ossila ltd. or Sigma Aldrich) in various solvents at various concentrations and stirring at room temperature for at least 30 minutes. The $PC_{71}BM$ concentrations for optimized PffBT-T3(1,2)-2:$PC_{71}BM$ devices were 40 mg/mL in ODCB:CB (1:1 volume ratio). These solutions were then spin-cast on top of the PffBT-T3(1,2)-2 layer from the previous step at 1000 rpm for 60 s. For optimized thermally annealed samples, the films were heated to 100° C. for 5 min on a hot plate under a nitrogen atmosphere. Anode deposition consisted of ~7 nm of $V_2O_5$ evaporated at rates below 1 Å/s followed by 100 nm of Al at ~1 Å/s. The resulting device active areas were 5.9 mm$^2$ for the small area devices and 100 mm$^2$ for large area devices.

For BC BHJ PffBT-T3(1,2)-2:$PC_{71}BM$ devices, except for the active layer fabrication procedure, all the subsequent steps were identical to those for the SqP devices. All of our blend solutions had PffBT-T3(1,2)-2 concentrations of 9 mg/mL in a mixed solution of ODCB:CB (1:1 volume ratio). 1:1.5 polymer:fullerene weight ratios were used. The solutions were stirred at elevated temperatures (90-120° C.) for at least 1 hour prior to being spun onto the preheated ZnO covered substrates at spin speeds ranging from 600 to 1000 rpm for 40 s. The samples were brought into vacuum and were kept under vacuum for at least 10 min prior to being thermally annealed at 100° C. for 5 min.

Example 4—Characterization of
Polymers:Fullerene-Based BC and SqP Devices

Example 3a: Optical Properties—Pure Polymers

Figure 2:
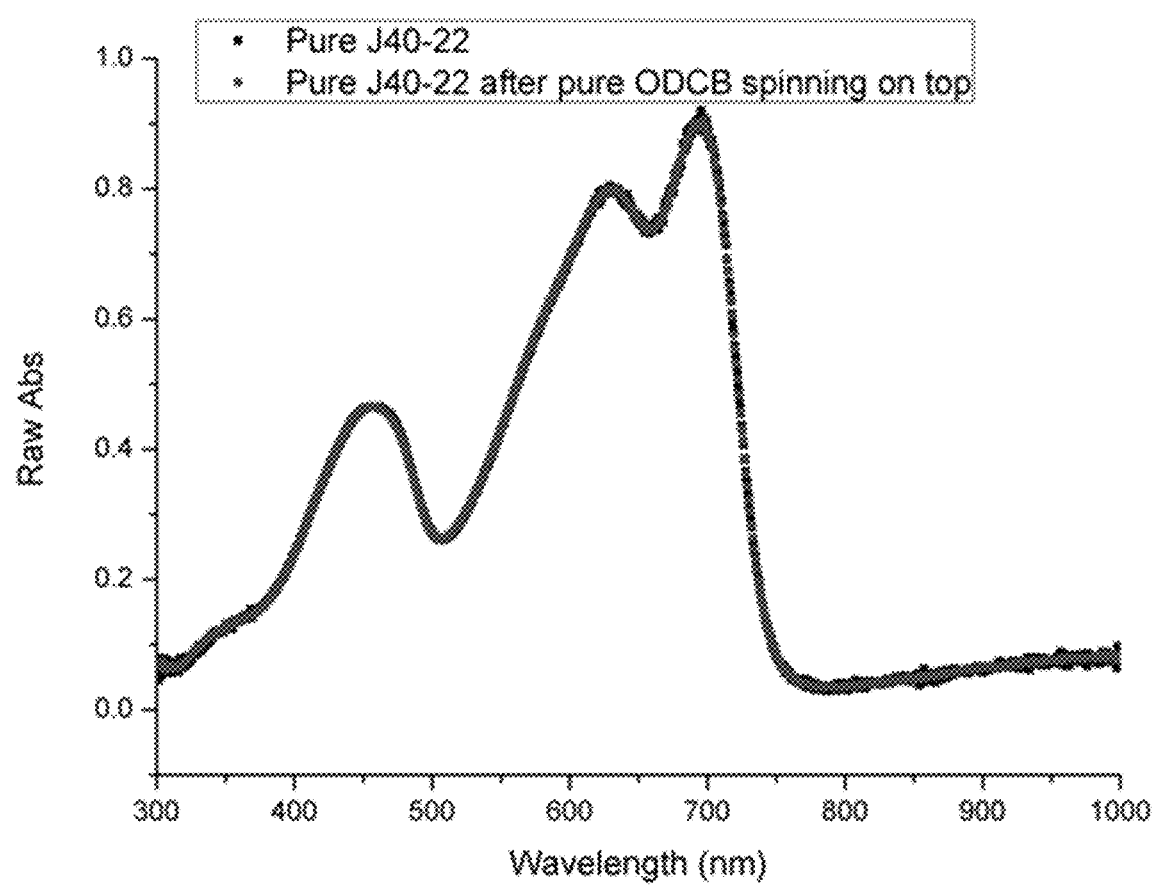
FIG. 2 depicts the UV-Vis spectra of a PffBT4T-$C_9C_{13}$ film before and after spin-coating of pure ODCB on top.
Figure 3:
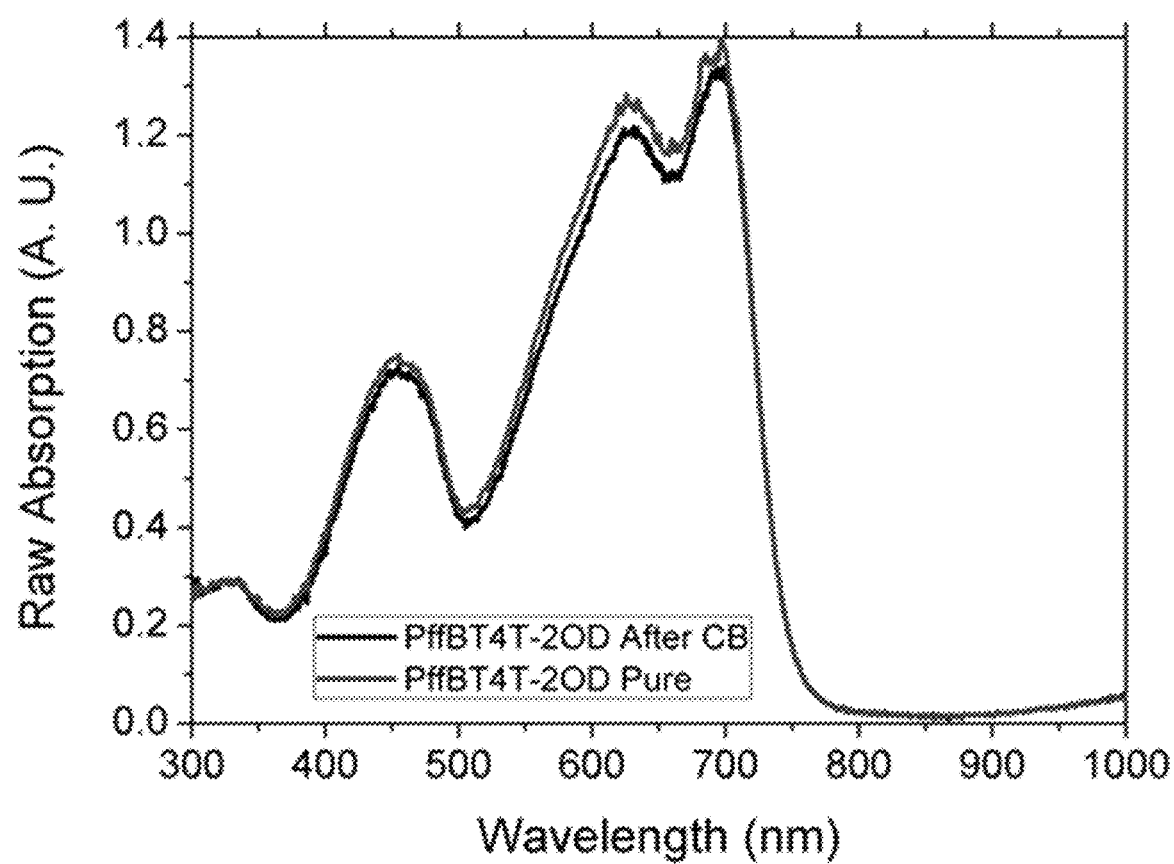
FIG. 3 depicts the UV-Vis spectra of a PffBT4T-2OD film before and after spin-coating of pure CB on top.

Film UV-Vis absorption spectra of pure polymers from Example 1 and 2 were acquired on a Perkin Elmer Lambda 20 UV/VIS Spectrophotometer. All film samples were spin-cast on ITO/ZnO substrates. It is clear that the spin-coating of ODCB on pure PffBT4T-$C_9C_{13}$ and CB on pure PffBT4T-2OD does not change the polymers' optical densities. This shows the polymer underlayers were not dissolved or partially dissolved after spin-coating of fullerene solutions in Example 1 and 2. The optical absorption spectrum is shown in FIG. 2 and FIG. 3.

Example 3b: Optical
Properties—PffBT4T-2OD:$PC_{71}BM$ BHJ Films

Figure 4:
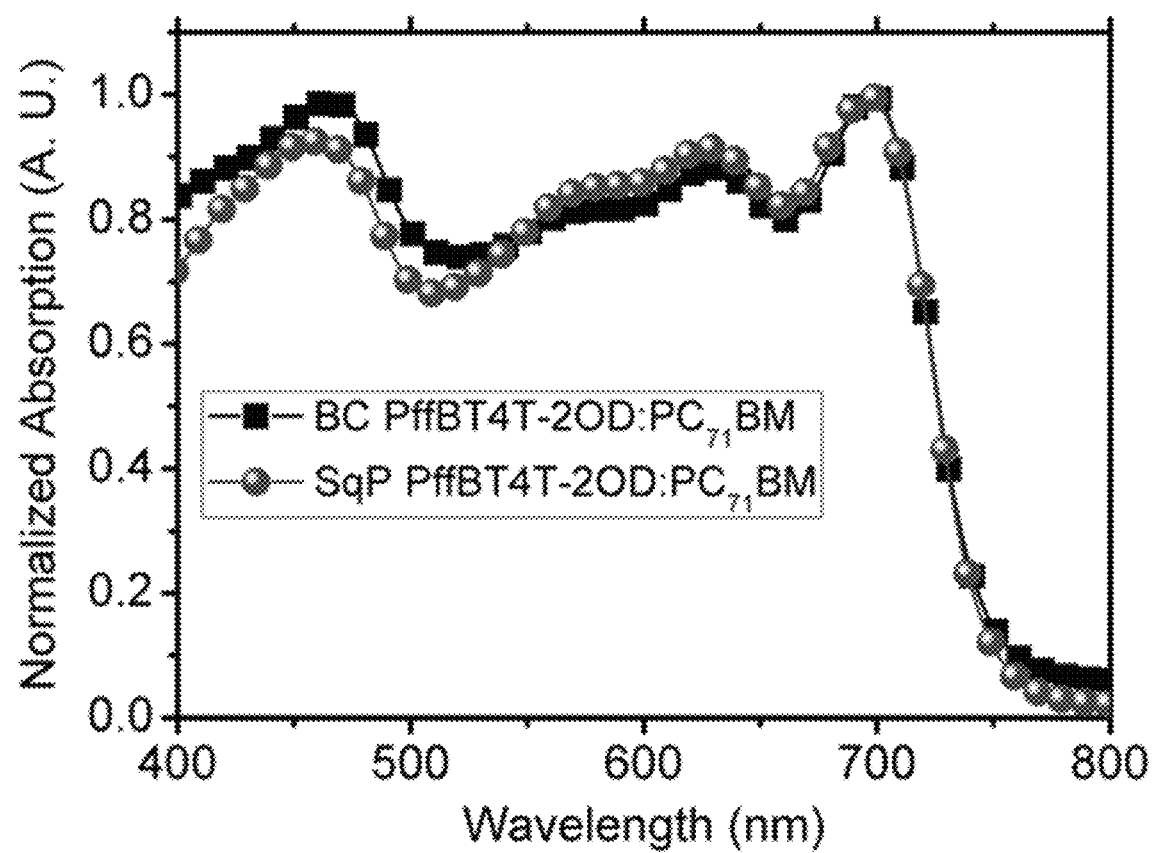
FIG. 4 depicts the UV-Vis spectra of PffBT4T-2OD:$PC_{71}BM$ films prepared by BC (squares) and SqP (circles) at their optimized device conditions.

Film UV-Vis absorption spectra of BC and SqP PffBT4T-2OD:$PC_{71}BM$ films from Example 1 were acquired on a Perkin Elmer Lambda 20 UV/VIS Spectrophotometer. All film samples were spin-cast on ITO/ZnO substrates. The optical absorption spectrum is shown in FIG. 4.

Example 3c: Optical Properties—PffBT4T-$C_9C_{13}$:
$PC_{71}BM$ BHJ Films

Figure 5:
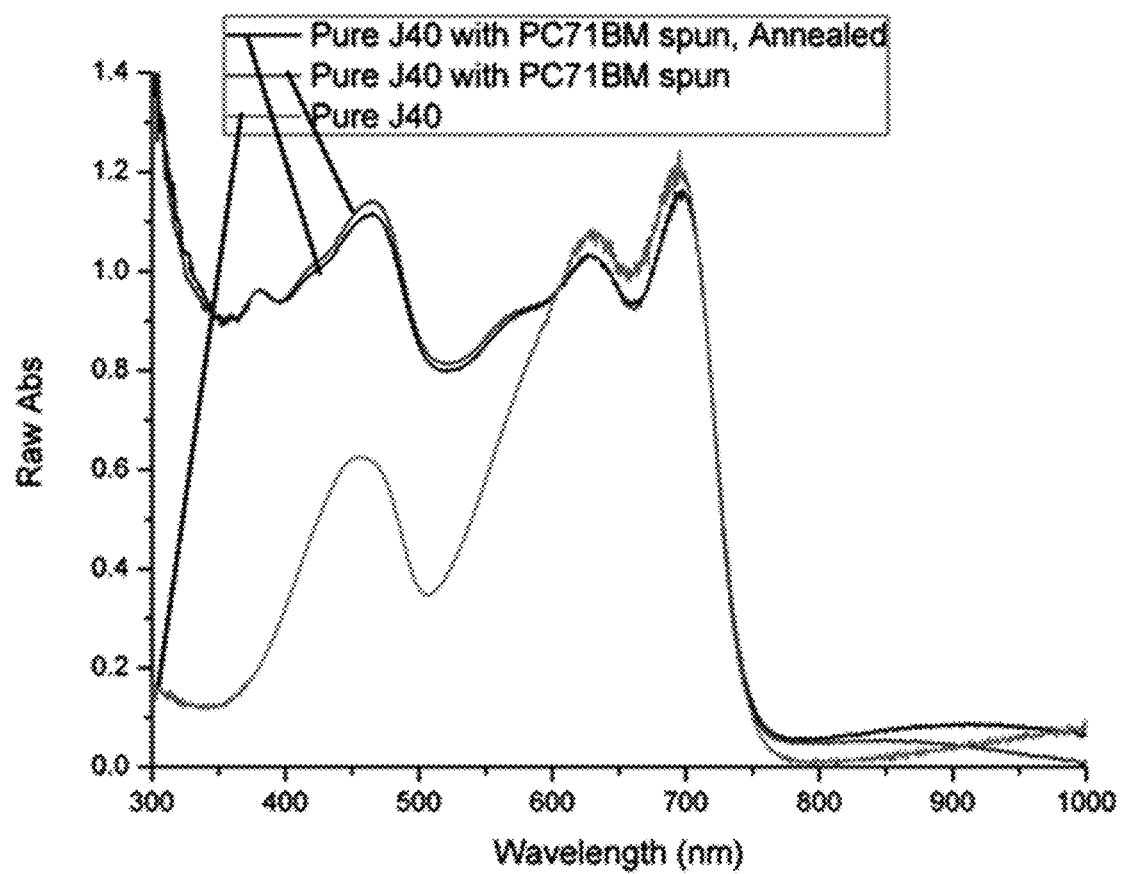
FIG. 5 depicts the UV-Vis spectra of a pure PffBT4T-$C_9C_{13}$ film, an as-cast SqP PffBT4T-$C_9C_{13}$:$PC_{71}BM$ film and a thermally annealed (100° C., 5 min) SqP PffBT4T-$C_9C_{13}$:$PC_{71}BM$ film prepared at conditions for their optimized device performance.

Film UV-Vis absorption spectra of pure polymer and SqP PffBT4T-$C_9C_{13}$:$PC_{71}BM$ films (as-cast and thermally annealed) from Example 2 were acquired on a Perkin Elmer Lambda 20 UV/VIS Spectrophotometer. All film samples were spin-cast on ITO/ZnO substrates. The optical absorption spectrum is shown in FIG. 5.

Example 3d: Optical Properties—PffBT4T-$C_9C_{13}$:
$PC_{71}BM$ BHJ Films

Figure 6:
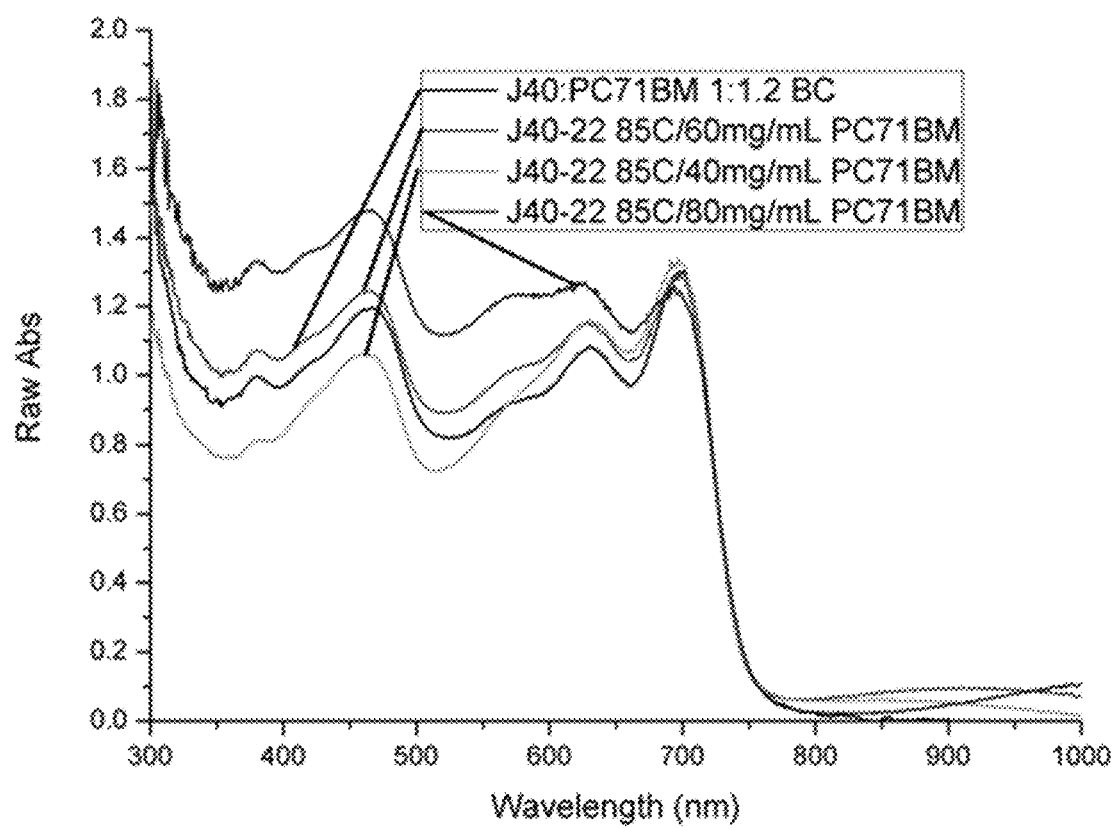
FIG. 6 depicts the UV-Vis spectra of a BC PffBT4T-$C_9C_{13}$:$PC_{71}BM$ film and a series of SqP PffBT4T-$C_9C_{13}$:$PC_{71}BM$ films with the same polymer underlayer thickness but different $PC_{71}BM$ concentrations spun on top.

Film UV-Vis absorption spectra of pure polymer and SqP PffBT4T-$C_9C_{13}$:$PC_{71}BM$ films with different fullerene concentrations from Example 2 were acquired on a Perkin Elmer Lambda 20 UV/VIS Spectrophotometer. All film samples were spin-cast on ITO/ZnO substrates. The optical absorption spectrum is shown in FIG. 6.

Example 4—Device Performance

Figure 7:
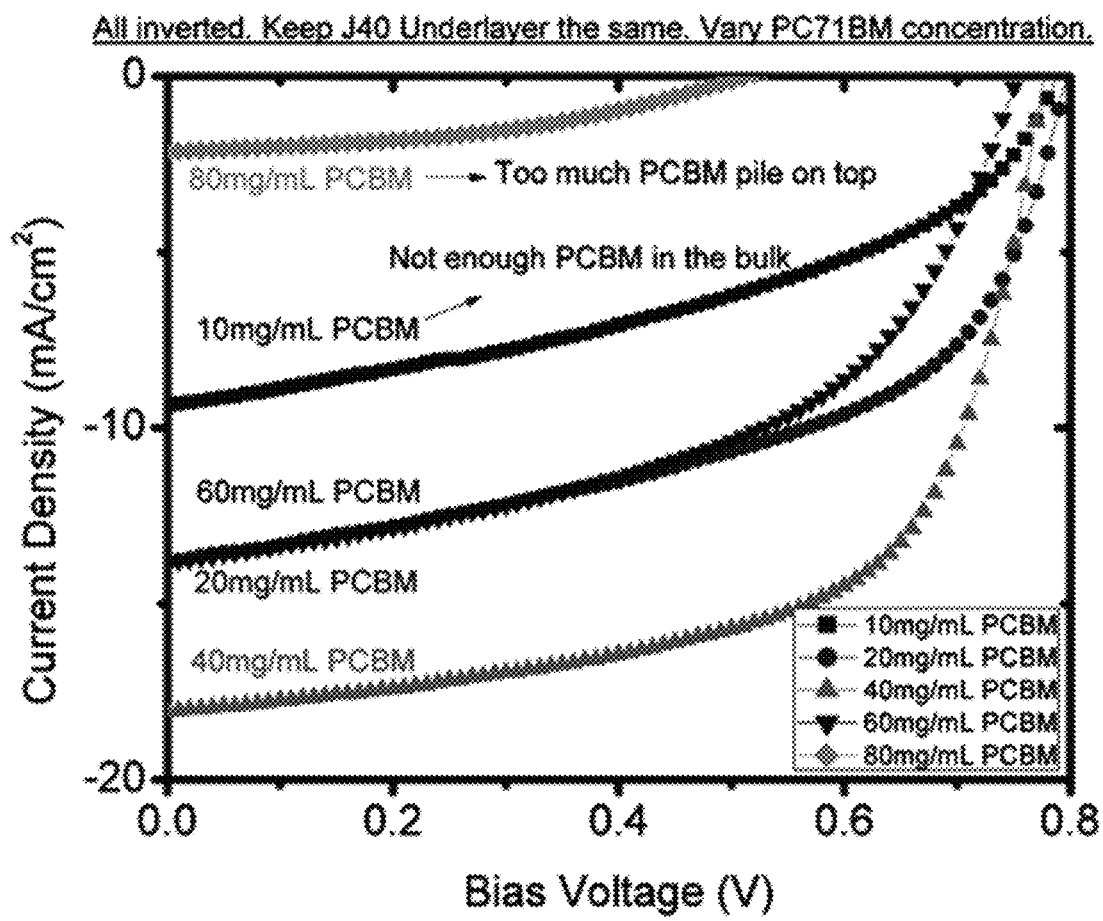
FIG. 7 depicts the J-V characteristics of a series of SqP PffBT4T-$C_9C_{13}$:$PC_{71}BM$ devices with the same polymer underlayer thickness, but with different $PC_{71}BM$ concentrations spun on top.
Figure 8:
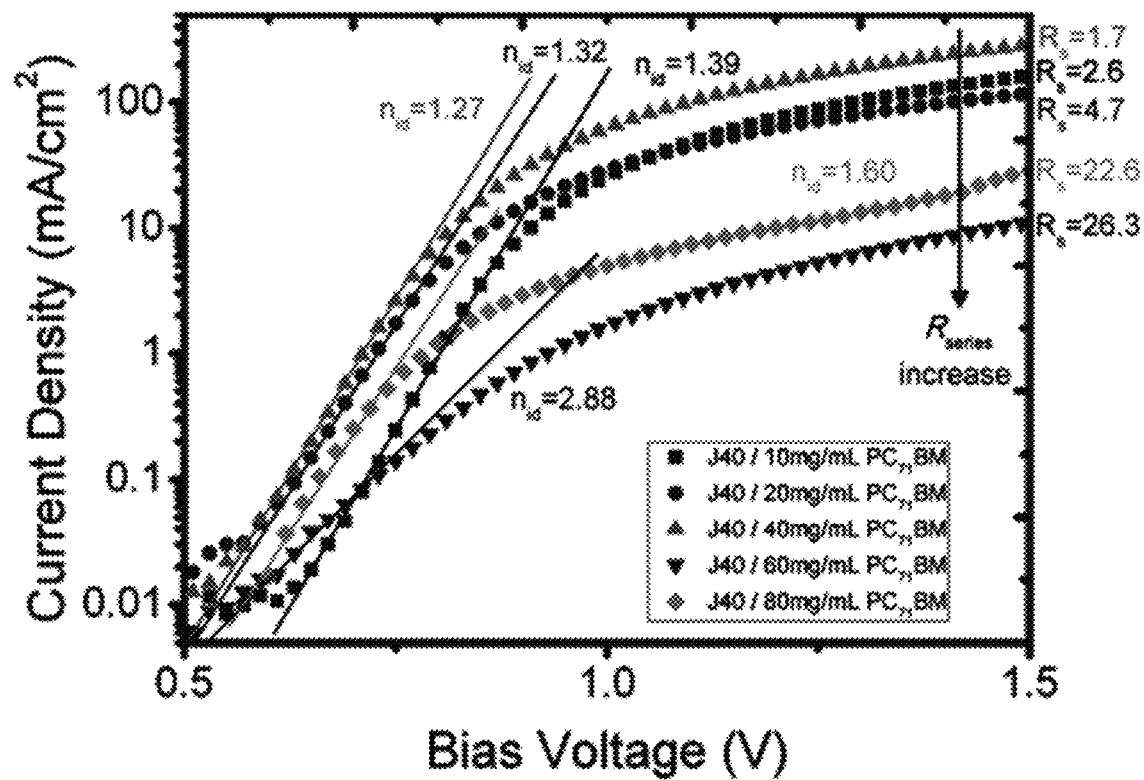
FIG. 8 depicts the J-V characteristics (under dark) of a series of SqP PffBT4T-$C_9C_{13}$:$PC_{71}BM$ devices with the same polymer underlayer thickness, but with different $PC_{71}BM$ concentrations spun on top.

Example 4a: Photovoltaic Cell J-V Characteristics Based on SqP PffBT4T-C$_9$C$_{13}$:PC$_{71}$BM Device J-V characteristics was measured under air mass 1.5 global (100 mW cm') using a Newport Class A solar simulator (94021 Å, a Xenon lamp with an AM1.5G filter). A standard crystalline Si solar cell with a KG5 filter was purchased from PV Measurements and calibrated by Newport Corporation. The light intensity was calibrated using the standard Si diode to bring spectral mismatch to unity. J-V characteristics were recorded using a Keithley 236 or 2400 source meter unit. Typical cells have devices area of ~5.9 mm$^2$, which is defined by a metal mask with an aperture aligned with the device area. EQEs were characterized using a Newport EQE system equipped with a standard Si diode. Monochromatic light was generated from a Newport 300 W lamp source. The J-V curves of PffBT4T-C$_9$C$_{13}$:PC$_{71}$BM devices with same polymer underlayer thickness but different fullerene concentrations are shown in FIG. 7. It is clear that 40 mg/mL is the optimized fullerene concentration for thusly prepared PffBT4T-C$_9$C$_{13}$ underlayer. Too dilute fullerene concentration results in insufficient fullerene incorporation in the polymer:fullerene matrix while too concentrated fullerene solutions result in an over-thick fullerene top layer. The dark J-V curves of the same devices and the characteristic parameters are shown in FIG. 8. It is clear that the optimized devices show the lowest ideality factor (lowest amount trap-assisted recombination) and the smallest series resistance. This is consistent with the result from FIG. 7.

Figure 9:
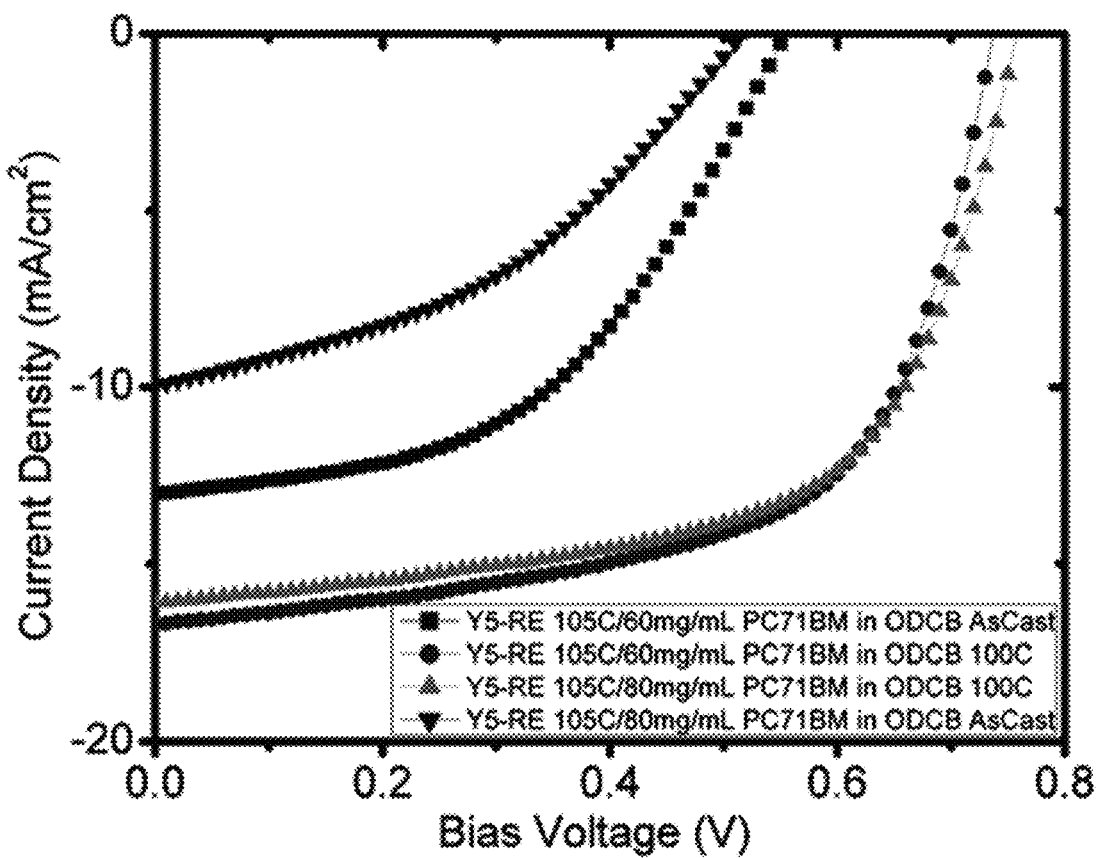
FIG. 9 depicts the J-V characteristics of a series of SqP PffBT4T-2OD:$PC_{71}BM$ devices with the same polymer underlayer thickness but different $PC_{71}BM$ concentrations spun on top, both as cast (squares and down triangles) and thermally annealed (circles and up triangles).

Example 4b: Photovoltaic Cell J-V Characteristics Based on SqP PffBT4T-2OD:PC$_{71}$BM The J-V curves of PffBT4T-2OD:PC$_{71}$BM devices with same polymer underlayer thickness but different fullerene concentrations are shown in FIG. 9, together with the comparison between as-cast and thermally annealed devices. It is clear that as-cast devices perform worse than the annealed ones.

Figure 10:
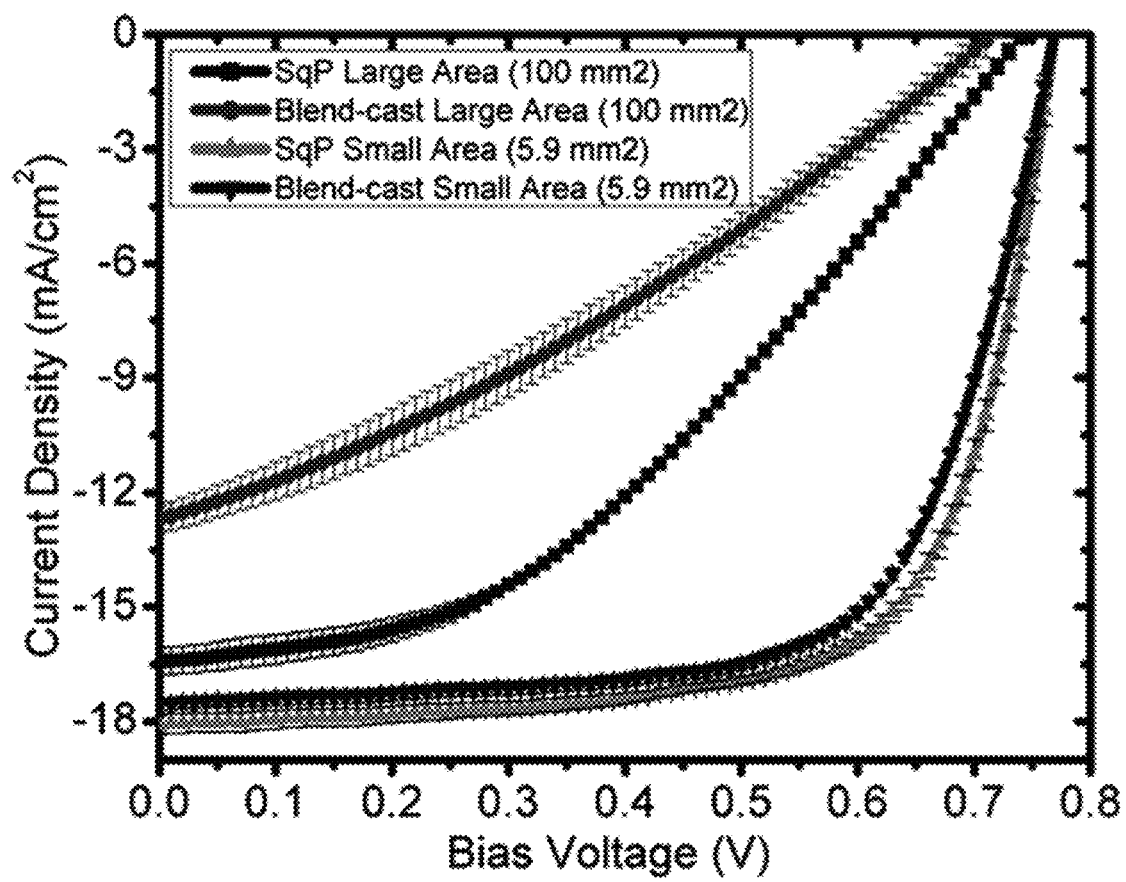
FIG. 10 depicts the J-V characteristics of PffBT4T-2OD:$PC_{71}BM$ devices with different device area (small v. s. large), prepared by different methods (BC v. s. SqP). Error bars show 1-standard deviations based on at 6 independent devices.

Example 4c: J-V Characteristics for Large and Small Area Devices Based on PffBT4T-2OD:PC$_{71}$BM The J-V curves of PffBT4T-2OD:PC$_{71}$BM devices with different device area are shown in FIG. 10, together with the comparison between BC and SqP devices. It is clear that SqP provides devices with similar PCEs as the BC ones when the device area is small. However, for large area devices, SqP provides more efficient and more reproducible solar cells than BC. The device area for small and large devices are 5.9 mm$^2$ and 100 mm$^2$, respectively.

Figure 11:
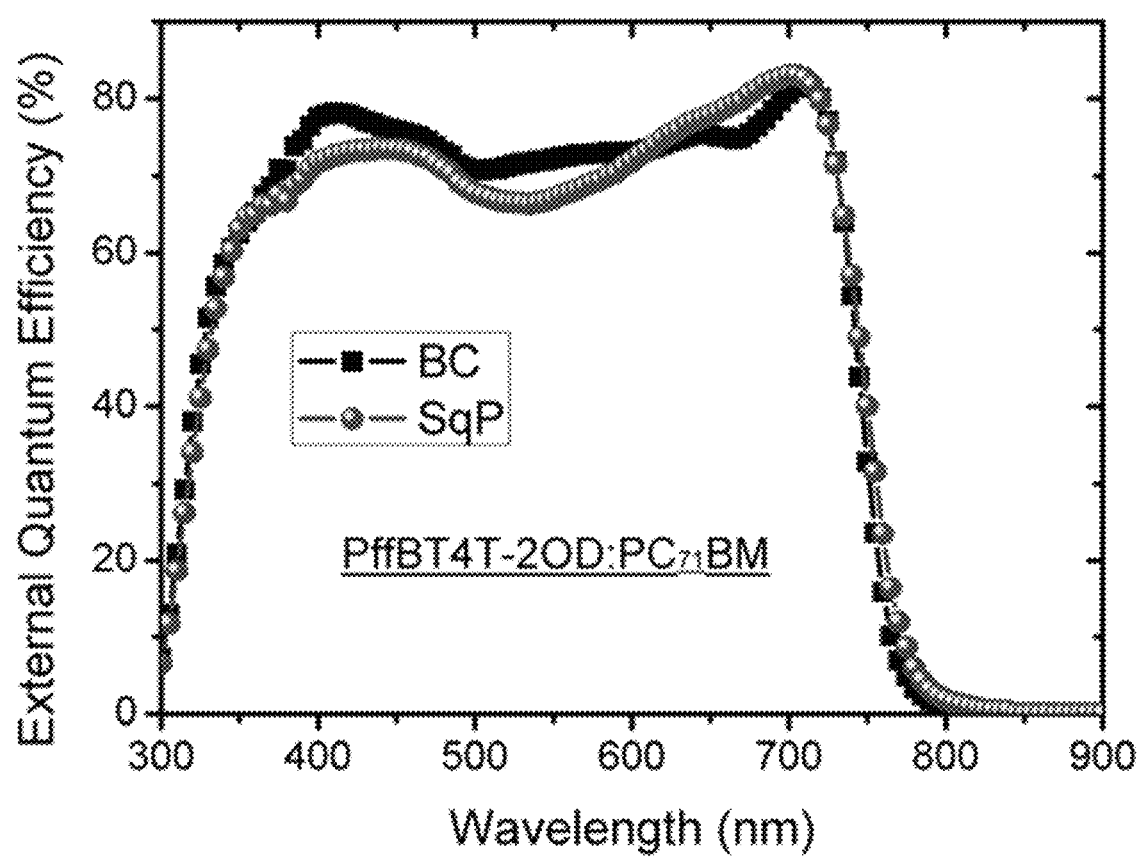
FIG. 11 depicts the external quantum efficiency spectra of optimized small area PffBT4T-2OD:$PC_{71}BM$ devices prepare by BC (squares) and SqP (circles).

Example 4d: External Quantum Efficiencies for Large and Small Area Devices Based on PffBT4T-2OD:PC$_{71}$BM The external quantum efficiency (EQE) curves of the same small area devices used in Example 4c are shown in FIG. PffBT4T-2OD:PC$_{71}$BM devices with different device area are shown in FIG. 11.

Figure 12:
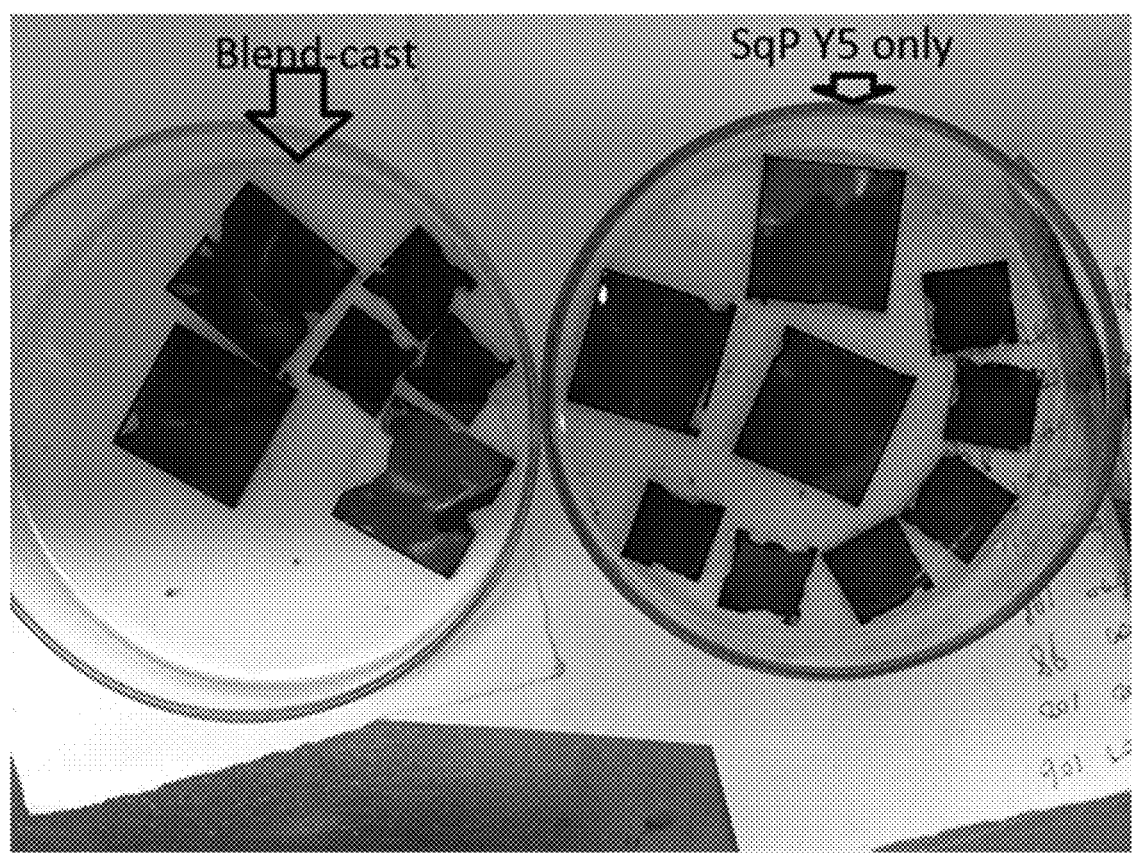
FIG. 12 depicts photos of BC PffBT4T-2OD:$PC_{71}BM$ films (left) and SqP PffBT4T-2OD films (right) before $PC_{71}BM$ deposition. The different film sizes are for the fabrication of devices with different area.
Figure 13:
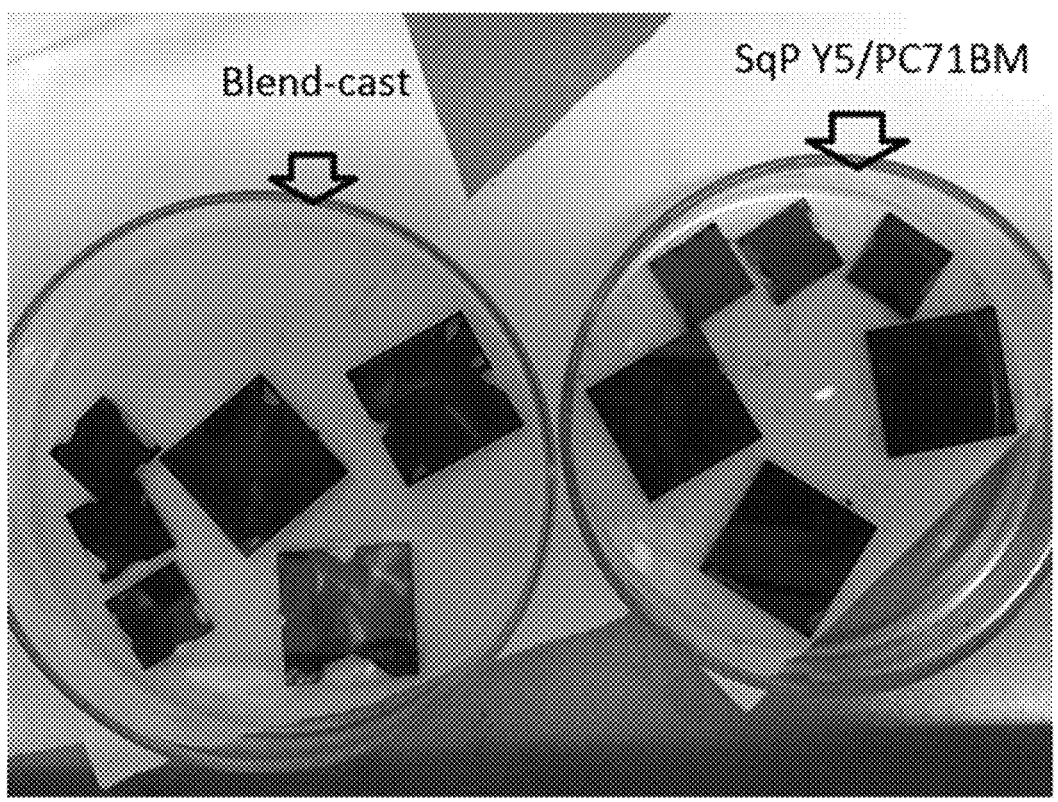
FIG. 13 depicts photos of BC PffBT4T-2OD:$PC_{71}BM$ films (left) and SqP PffBT4T-2OD films (right) after $PC_{71}BM$ deposition. The different film sizes are for the fabrication of devices with different area.
Figure 14:
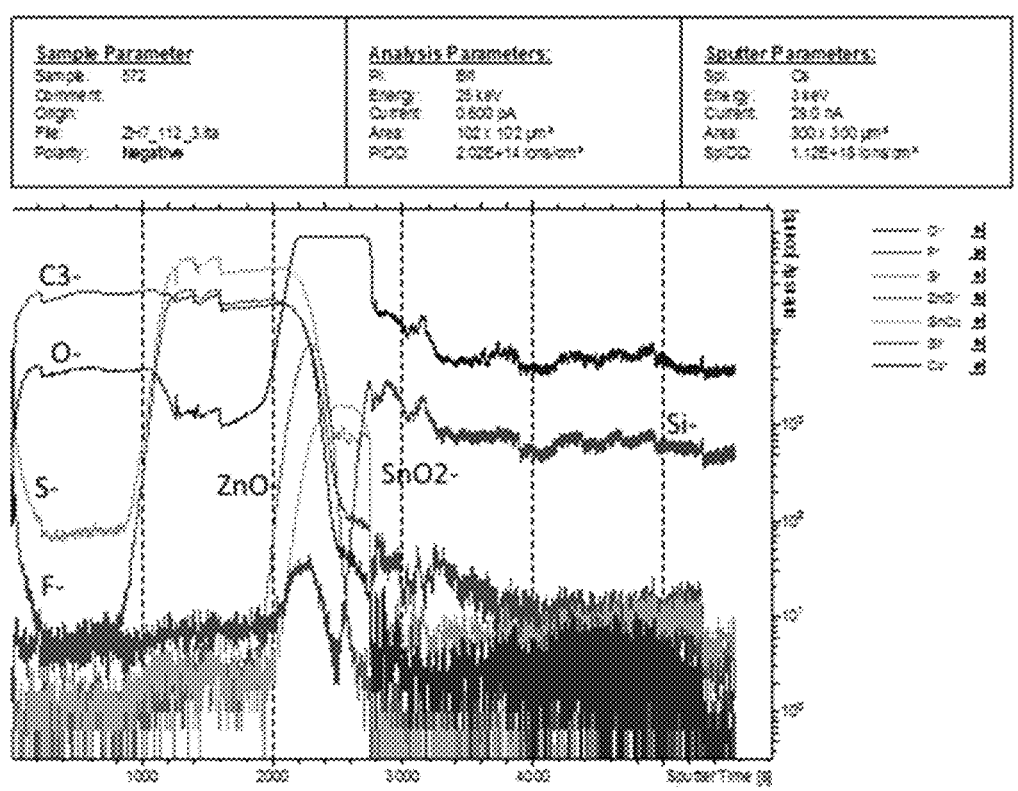
FIG. 14 depicts the depth profile of an as-cast SqP PffBT4T-2OD:$PC_{71}BM$ film measured by secondary ion mass spectrometry.
Figure 15:
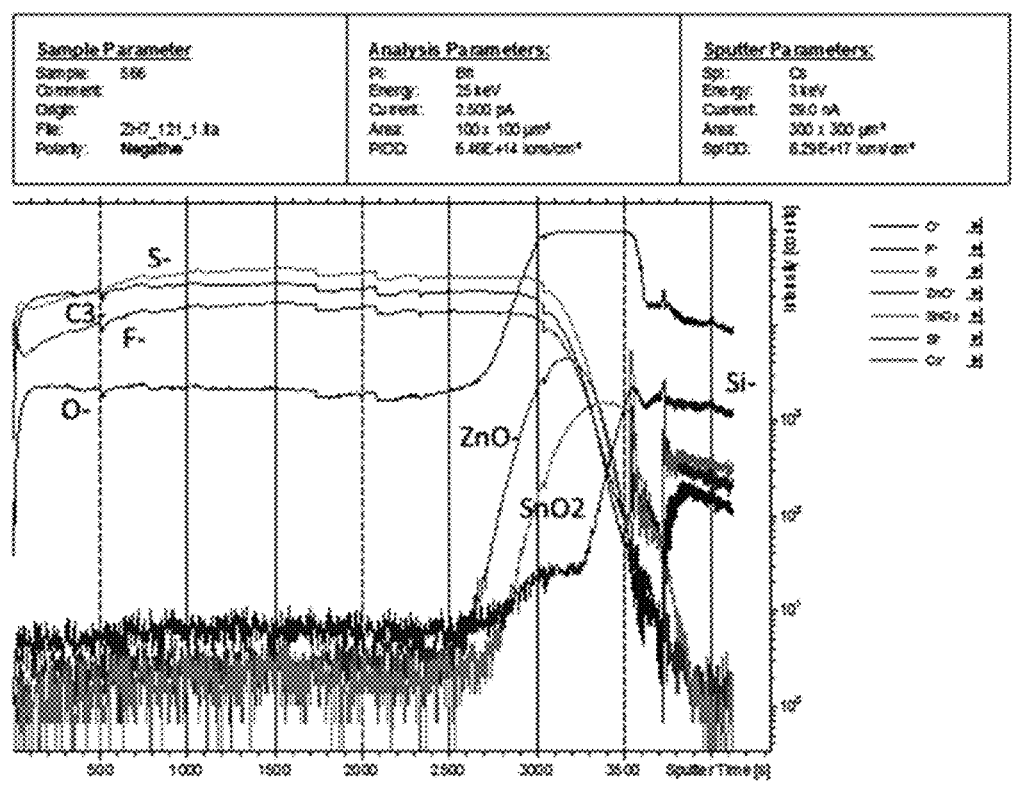
FIG. 15 depicts the depth profile of a thermally annealed SqP PffBT4T-2OD:$PC_{71}BM$ film measured by secondary ion mass spectrometry.
Figure 16:
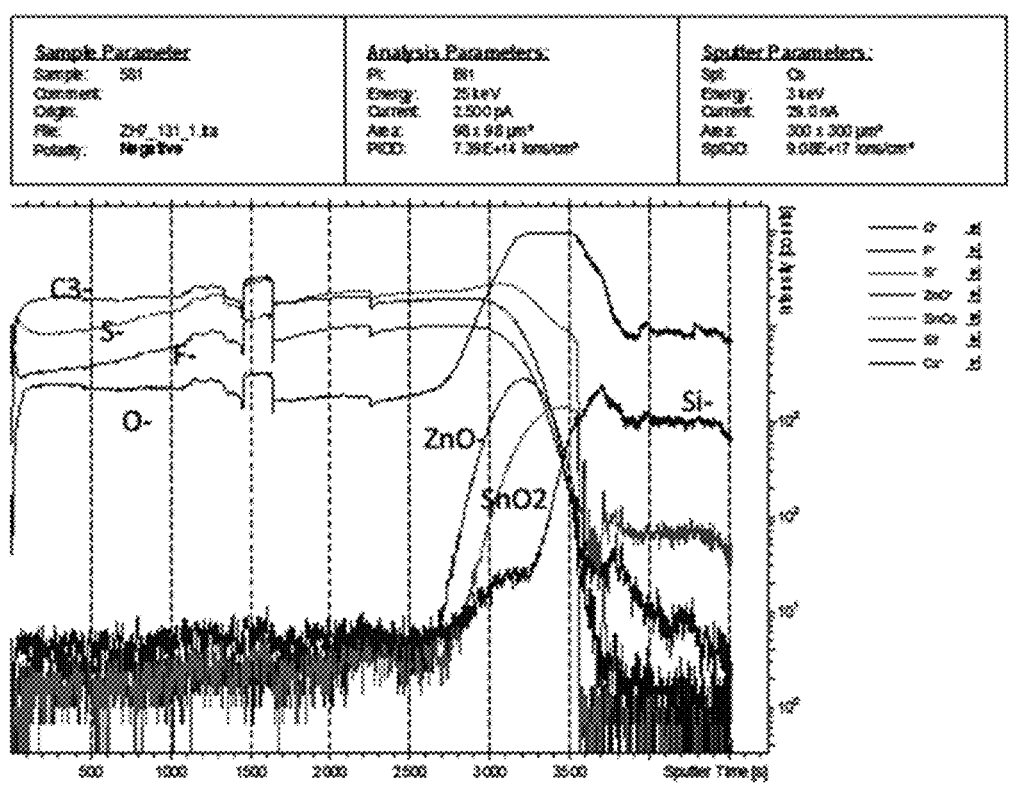
FIG. 16 depicts the depth profile of an as-cast SqP PffBT4T-2OD:$PC_{71}BM$ film with DIO added into the pure PffBT4T-2OD solution, measured by secondaryion mass spectrometry.
Figure 17:
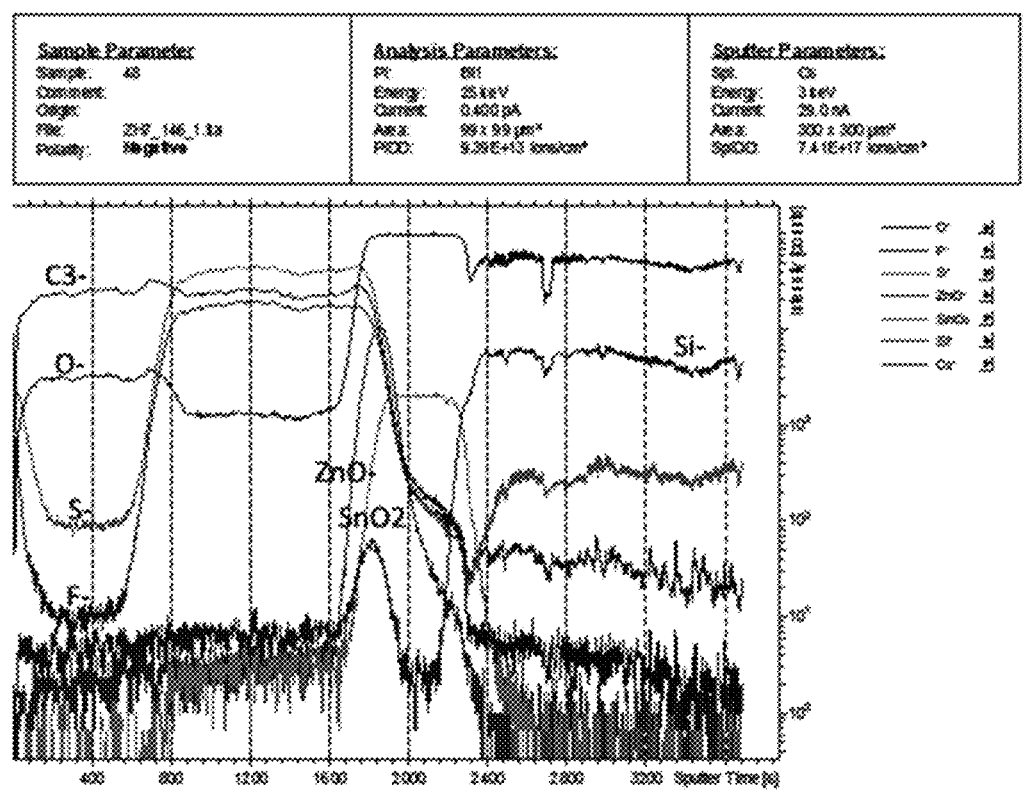
FIG. 17 depicts the depth profile of an as-cast SqP PffBT4T-$C_9C_{13}$:$PC_{71}BM$ film measured by secondary ion mass spectrometry.
Figure 18:
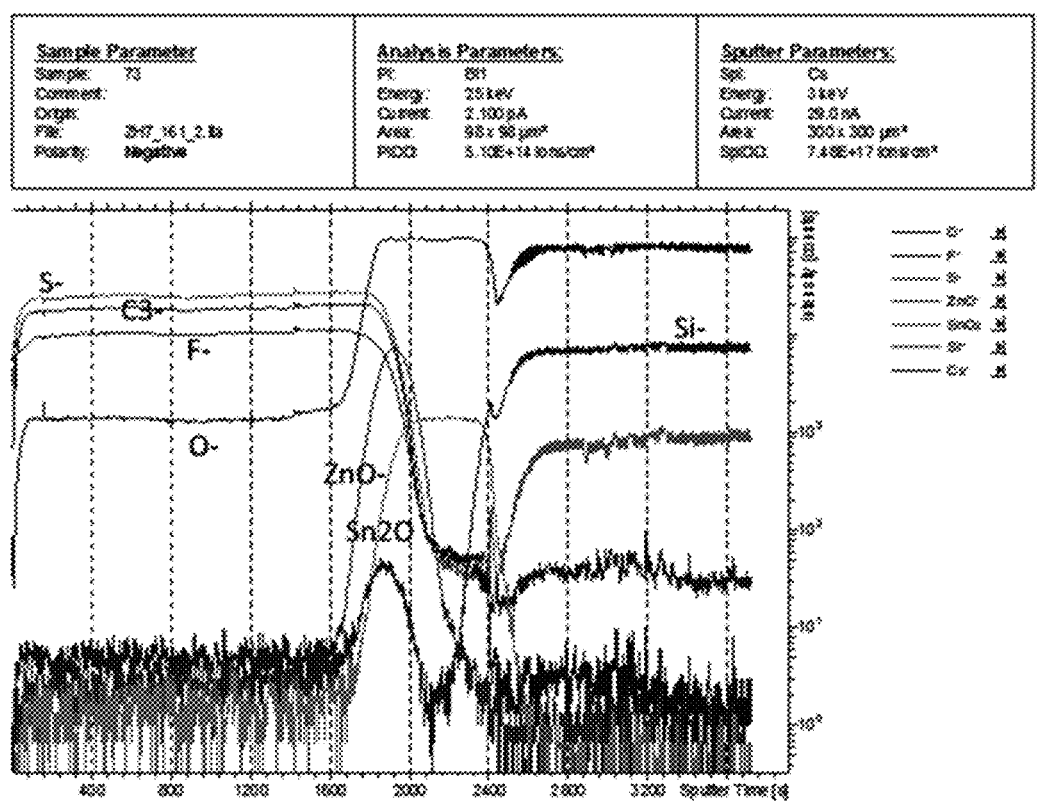
FIG. 18 depicts the depth profile of a thermally annealed SqP PffBT4T-$C_9C_{13}$:$PC_{71}BM$ film measured by ss secondary ion mass spectrometry.
Figure 19:
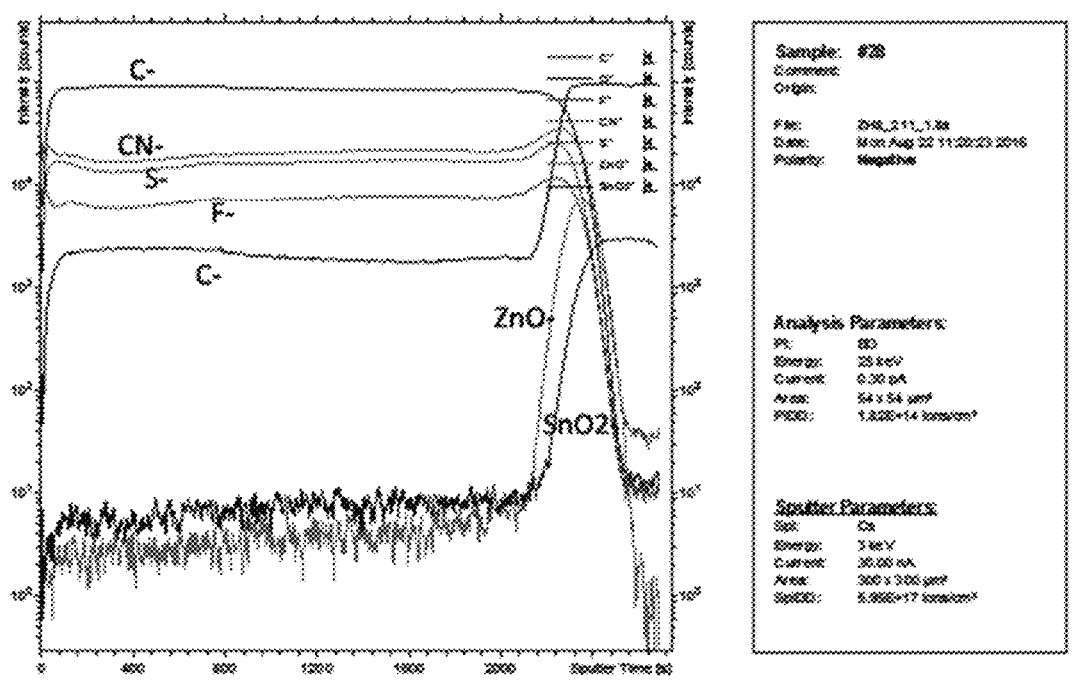
FIG. 19 depicts the depth profile of a thermally annealed BC PffBT4T-2OD:$PC_{71}BM$ film measured by secondary ion mass spectrometry.
Figure 20:
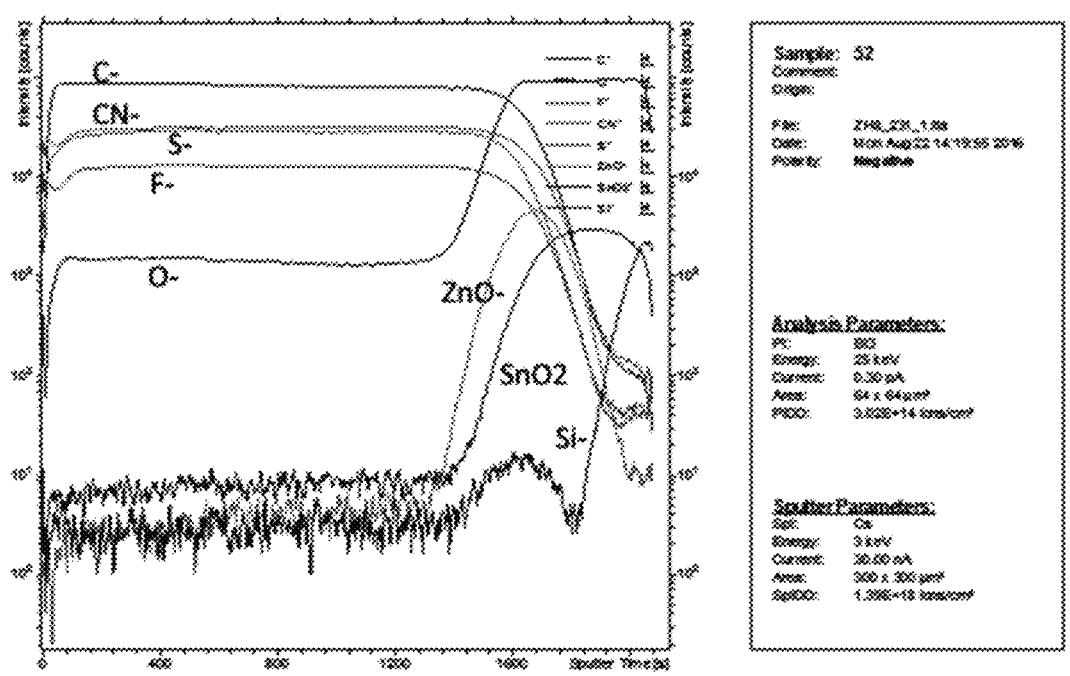
FIG. 20 depicts the depth profile of a thermally annealed BC PffBT4T-$C_9C_{13}$:$PC_{71}BM$ film measured by secondary ion mass spectrometry.

Example 4e: Photos of Large and Small Area Films Based on PffBT4T-2OD:PC$_{71}$BM Photos taken on different steps during the fabrication of BC and SqP devices are shown in FIG. 12 and FIG. 13. FIG. 12 shows the BC PffBT4T-2OD:PC$_{71}$BM films in different sizes (left) and the pure PffBT4T-2OD films in different sizes (right) prior to the deposition of PC$_{71}$BM during the SqP active layer preparation. FIG. 13 shows the BC PffBT4T-2OD:PC$_{71}$BM films in different sizes (left) and the SqP PffBT4T-2OD:PC$_{71}$BM films in different sizes (right) prior to the deposition of PC$_{71}$BM during the SqP active layer preparation. It is clear that for small area films, both BC and SqP provide good quality films with high homogeneity. For large area films, it is clear the formation of good quality pure PffBT4T-2OD films enables the formation of good quality SqP PffBT4T-2OD:PC$_{71}$BM films even after PC$_{71}$BM deposition, whereas the BC films show "cracks" in the middle.

Example 5—Vertical Phase Segregation of BC and SqP Devices

Using dynamic SIMS, the depth profiles of BC and SqP films used in Example 1 and 2 are obtained. FIG. 14-FIG. 20 show the depth profiles of these samples. There are three general conclusions about the vertical phase distribution of materials. First, as-cast SqP polymer:fullerene films have a thick fullerene over layer sitting on top of the polymer underlayer. Second, for SqP samples, thermal annealing drives the fullerenes into the polymer underlayer. Third, for SqP samples, if the polymer underlayer was formed using a solution containing DIO, the residue DIO drives the fullerene into the polymer underlayer, similar to effect of thermal annealing.

The foregoing examples are presented for the purpose of illustrating the invention and should not be construed as imposing any limitation on the scope of the invention. It will readily be apparent that numerous modifications and alterations may be made to the specific embodiments of the invention described above and illustrated in the examples without departing from the principles underlying the invention. All such modifications and alterations are intended to be embraced by this application.

What is claimed is:

1. A method of preparing a bulk heterojunction material comprising the steps of:
   a. providing a thin film comprising a donor material, wherein the donor material exhibits temperature dependent aggregation;
   b. depositing an acceptor solution comprising an acceptor solvent and an acceptor material on the thin film, wherein the donor material is substantially insoluble in the acceptor solvent; and
   c. annealing the acceptor material on the thin film thereby forming the bulk heterojunction material.

2. The method of claim 1, wherein the donor material is a polymer selected from the group consisting of:
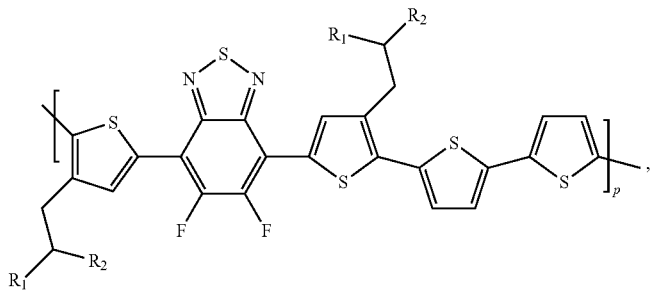
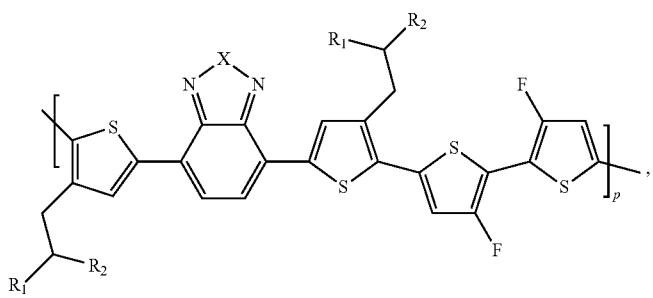
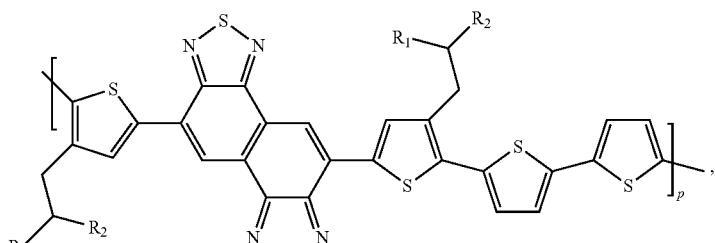
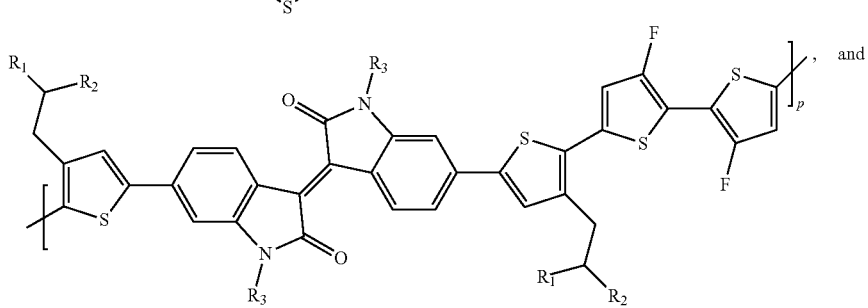, and
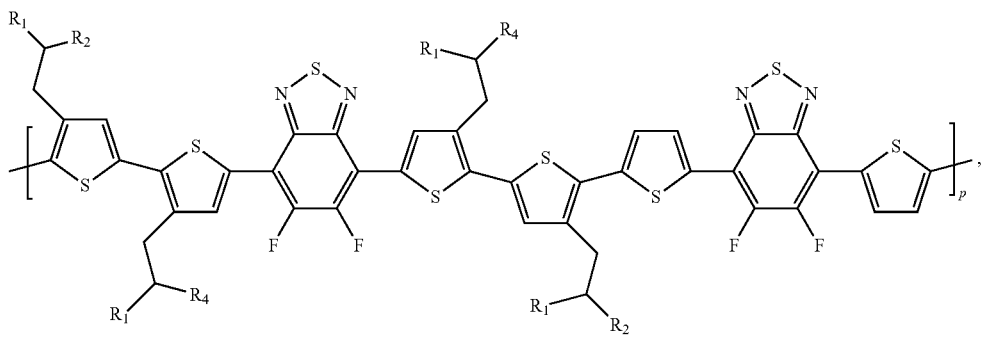, wherein p is 20-500;

X is S or $N(C_1-C_{12})$alkyl;

each of $R_1$, $R_2$, and $R_4$ is independently $(C_5-C_{30})$alkyl; and $R_3$ is $(C_4-C_{12})$alkyl.

3. The method of claim 1, further comprising the step of depositing a donor solution comprising a donor solvent and the donor material on a surface of a substrate thereby forming the substrate and a thin film comprising the donor material.

4. The method of claim 3, wherein the donor solvent comprises at least one of 1,2,4-trimethylbenzene, chlorobenzene, and 1,2-dichlorbenzene.

5. The method of claim 4, wherein the donor solvent further comprises 1,8-diiodooctane.

6. The method of claim 4, wherein the temperature of the donor solution is above the temperature that the donor material aggregates in the donor solvent.

7. The method of claim 6, wherein the temperature of the donor solution is about 60° C. to about 150° C.

8. The method of claim 1, wherein the thin film comprising the donor material comprises a plurality of substantially crystalline domains.

9. The method of claim 1, wherein the acceptor material is a $C_{60}$ or $C_{70}$ fullerene derivative.

10. The method of claim 9, wherein the acceptor solvent is at least one of chlorobenzene, 1,2-dichlorbenzene, and chloroform.

11. The method of claim 10, wherein the donor material is substantially insoluble at the temperature that the acceptor solution is deposited on the thin film.

12. The method of claim 11, wherein the temperature of the acceptor solution is about 20° C. to about 30° C.

13. The method of claim 2, further comprising the steps of depositing a donor solution comprising a donor solvent and the donor material on a surface of a substrate, wherein the donor solvent is at least one of 1,2,4-trimethylbenzene, chlorobenzene, and 1,2-dichlorbenzene; and the donor solution has a to of about 80° C. to about 120° C.

14. The method of claim 13, wherein the acceptor solvent is at least one of chlorobenzene, 1,2-dichlorbenzene, and chloroform; the acceptor material is a $C_{60}$ or $C_{70}$ fullerene derivative; and the temperature of the acceptor solution is about 20° C. to about 30° C.

15. The method of claim 14, wherein the $C_{60}$ or $C_{70}$ fullerene derivative is

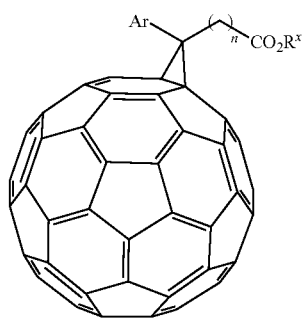

wherein n is 1, 2, 4, 5, or 6;

Ar is aryl or heteroaryl; and $R^X$ is alkyl, alkenyl, alkynyl, cycloalkyl, aryl, araalkyl, or heteroaryl.

16. The method of claim 14, wherein the acceptor material is selected from the group consisting of:

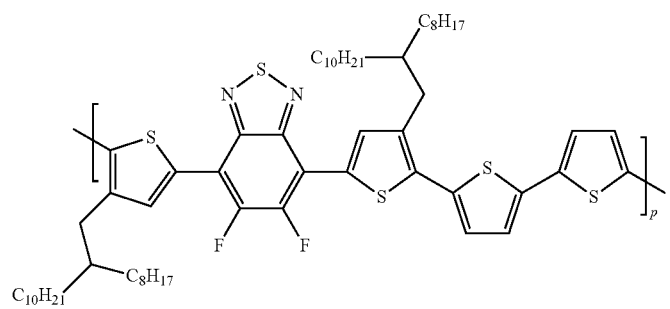

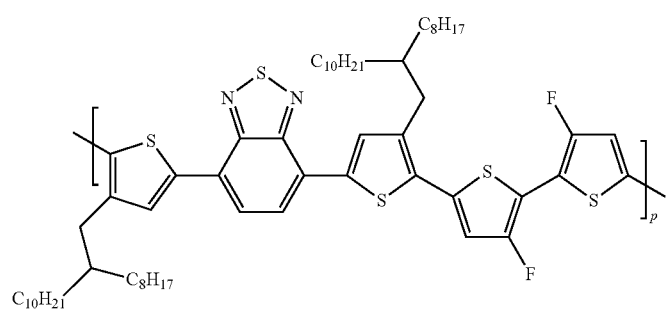

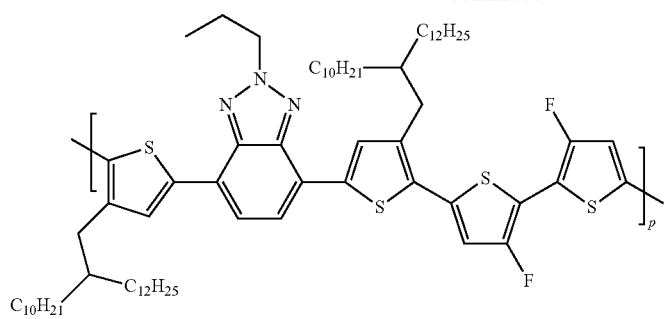
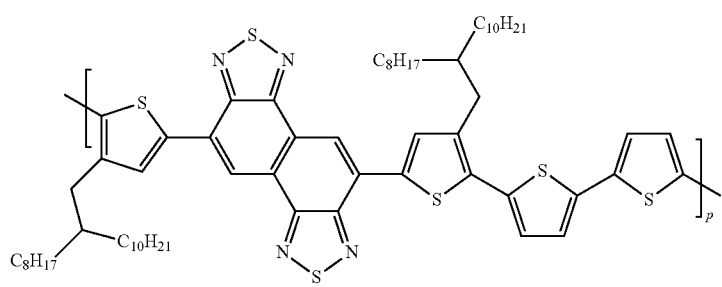
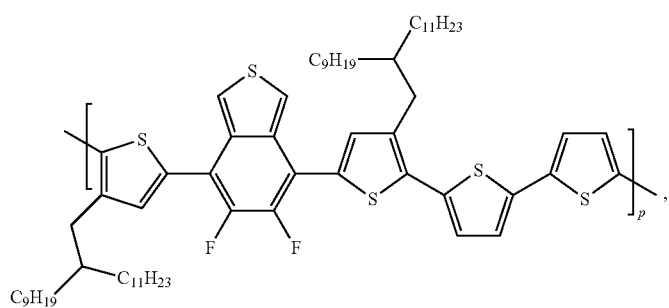
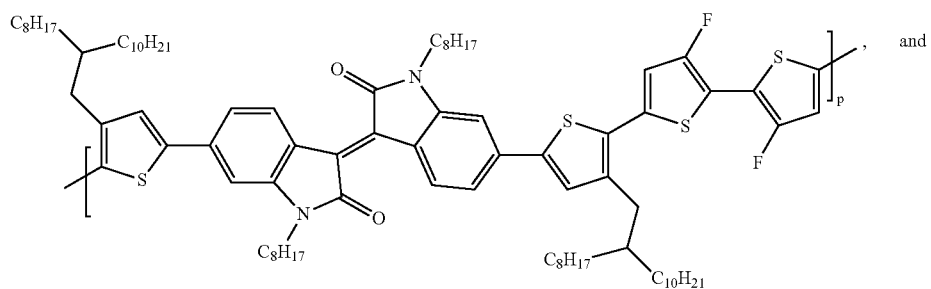
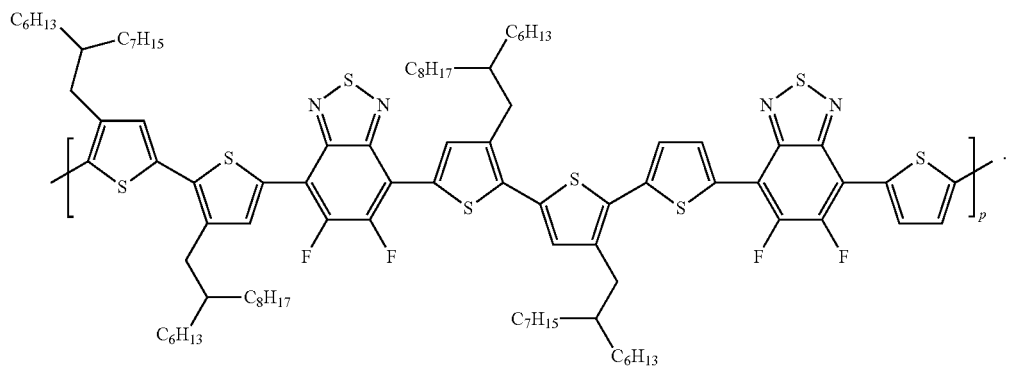

17. The method of claim 16, wherein the acceptor material is a $C_{70}$ fullerene derivative having the structure:

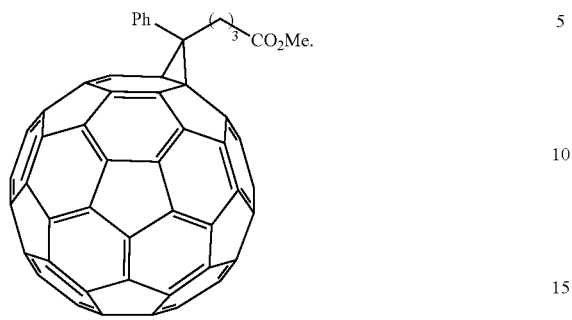

18. A bulk heterojunction material made according to the method of claim 1.

19. An organic electronic device comprising the bulk heterojunction material of claim 18.

20. The organic electronic device of claim 19, wherein the organic electronic device is an organic photovoltaic device or an organic field-effect transistor device.

* * * * *